United States Patent
Khan et al.

(10) Patent No.: US 10,992,022 B2
(45) Date of Patent: Apr. 27, 2021

(54) MICROWAVE ANTENNA APPARATUS, PACKING AND MANUFACTURING METHOD

(71) Applicant: SONY CORPORATION, Tokyo (JP)

(72) Inventors: Wasif Tanveer Khan, Lahore (PK); Ali Eray Topak, The Hague (NL); Arndt Thomas Ott, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/090,219

(22) PCT Filed: Mar. 31, 2017

(86) PCT No.: PCT/EP2017/057743
§ 371 (c)(1),
(2) Date: Sep. 29, 2018

(87) PCT Pub. No.: WO2017/167987
PCT Pub. Date: Oct. 5, 2017

(65) Prior Publication Data
US 2019/0115643 A1    Apr. 18, 2019

(30) Foreign Application Priority Data
Apr. 1, 2016 (EP) .................... 16163516

(51) Int. Cl.
*H01Q 1/22* (2006.01)
*H01Q 9/04* (2006.01)
(Continued)

(52) U.S. Cl.
CPC ........... *H01Q 1/2283* (2013.01); *H01L 23/66* (2013.01); *H01Q 9/0457* (2013.01);
(Continued)

(58) Field of Classification Search
CPC .............. H01Q 1/2283; H01L 23/66; H01L 2223/6677; H01L 2224/04105; H01L 2224/12105; H01L 2224/96
See application file for complete search history.

(56) References Cited

U.S. PATENT DOCUMENTS

| 7,675,465 B2 | 3/2010 | Doan et al. |
| 2007/0164420 A1* | 7/2007 | Chen ................. H01L 25/16 |
| | | 257/691 |

(Continued)

FOREIGN PATENT DOCUMENTS

JP    2015026873 A    2/2015

OTHER PUBLICATIONS

A. Fischer et al., "A 77-GHz Antenna in Package," Proceedings of the 41st European Microwave Conference (EuMC2011), Manchester, UK, pp. 1316-1319, Oct. 2011.

(Continued)

*Primary Examiner* — Robert Karacsony
(74) *Attorney, Agent, or Firm* — Xsensus LLP

(57) ABSTRACT

A microwave antenna apparatus comprises a semiconductor element and an antenna element embedded into a mold layer, which is covered by a redistribution layer. The antenna element is preferably configured as SMD component so that it can be handled by a standard pick and place process. The coupling between semiconductor element and antenna element is provided either by a metal layer or aperture coupling within the redistribution layer. The microwave antenna apparatus may be coupled to a PCB arrangement thus forming an embedded wafer-level ball grid array (eWLB) or embedded micro-wafer-level-packaging (emWLP) package.

16 Claims, 23 Drawing Sheets

(51) Int. Cl.
*H01Q 9/27* (2006.01)
*H01Q 11/08* (2006.01)
*H01Q 15/00* (2006.01)
*H01Q 9/42* (2006.01)
*H01L 23/66* (2006.01)
*H01Q 13/02* (2006.01)

(52) U.S. Cl.
CPC .............. *H01Q 9/0485* (2013.01); *H01Q 9/27* (2013.01); *H01Q 9/42* (2013.01); *H01Q 11/08* (2013.01); *H01Q 13/02* (2013.01); *H01Q 15/006* (2013.01); *H01Q 2223/6677* (2013.01); *H01L 2224/04105* (2013.01); *H01L 2224/12105* (2013.01); *H01L 2224/18* (2013.01); *H01L 2224/96* (2013.01)

(56) References Cited

U.S. PATENT DOCUMENTS

| | | | |
|---|---|---|---|
| 2011/0260939 | A1 | 10/2011 | Korva et al. |
| 2013/0292808 | A1* | 11/2013 | Yen .................. H01L 23/481 257/660 |
| 2014/0110840 | A1* | 4/2014 | Wojnowski ....... H01L 23/49822 257/738 |
| 2014/0145883 | A1 | 5/2014 | Baks et al. |
| 2014/0152509 | A1* | 6/2014 | Liu .................. H01Q 9/0407 343/700 MS |
| 2014/0287703 | A1 | 9/2014 | Herbsommer et al. |
| 2015/0070228 | A1 | 3/2015 | Gu et al. |
| 2015/0109068 | A1 | 4/2015 | Kawata |
| 2015/0130681 | A1 | 5/2015 | Hsieh et al. |
| 2015/0263403 | A1 | 9/2015 | Spella et al. |
| 2015/0364830 | A1* | 12/2015 | Tong .................. H01L 23/66 342/27 |

OTHER PUBLICATIONS

M. Henawy and M. Schneider. "Integrated Antennas in eWLB Packages for 77 GHz and 79 GHz Automotive Radar Sensors", Proceedings of the 41st European Microwave Conference (EuMC2011), Manchester, UK, pp. 1312-1315, Oct. 2011.
A. Hamidipour et al., "A Rhombic Antenna Array Solution in eWLB Package for Millimeter-Wave Applications," Proceedings of the 42nd European Microwave Conference ((EuMC2012), Amsterdam, The Netherlands, pp. 205-208, Oct. 29-Nov, 1, 2012.
Z. Tong et al., "Wideband Differential Antenna in Package with Superstrate Structure at 77 GHz", IEEE Asia-Pacific Conference on Antennas and Propagation, Aug. 27-29, 2012, Singapore.
M. PourMousavi et al., "Antenna Design and Characterization for a 61 GHz Transceiver in eWLB Package", Proceedings of the 8th European Microwave Integrated Circuits Conference, Oct. 6-8, 2013, Nuremberg, Germany.
A. Hamidipour et al., "Antennas in Package With Stacked Metallization," Proceedings of the 43rd European Microwave Conference, Oct. 7-10, 2013, Nuremberg, Germany.
A. Hamidipour et al., "160-GHz SiGe-Based Transmitter and Receiver With Highly Directional Antennas in Package," Proceedings of the 8th European Microwave Integrated Circuits Conference, Oct. 6-8, 2013, Nuremberg, Germany.
A. Fischer et al., "77-GHz Multi-Channel Radar Transceiver With Antenna in Package," IEEE Transactions on Antennas and Propagation, vol. 62, No. 3, Mar. 2014.
E. Seler et al.,Chip-to-Rectangular Waveguide Transition Realized in embedded Wafer Level Ball Grid Array (eWLB) Package, IEEE, 2014.
Supreetha Rao Aroor, et al., "Loss Performance of Planar Interconnects on FR-4 up to 67 GHz", IEEE Transactions on Components, Packaging and Manufacturing Technology, vol. 3, No. 12, Dec. 2013.
Wasif Tanveer Khan, "Design and Development of Organically Packaged Components and Modules for Microwave and MillimeterWave Applications", A Ph.D. Dissertation Georgia Institute of Technology, Dec. 2014.
Puthiyapurayil V. Vinesh, et al., "A Compact Capacitive Coupled Dual-Band Planar Inverted F Antenna", Progress in Electromagnetics Research C, vol. 52, 93-99, 2014.
A. Bakhtafrooz, et al., "Novel Two-Layer Millimeter-Wave Slot Array Antennas Based on Substrate Integrated Waveguides", Progress in Electromagnetics Research, vol. 109, 475-491, 2010.
Brebels S., et al., "Compact LTCC antenna package for 60 GHz wireless transmission of uncompressed video," 2011 IEEE MTT-S International Microwave Symposium, Jun. 5, 2011, pp. 1-4 (See Abstract).
Seier, E et al., "3D rectangular waveguide integrated in embedded Wafer Level Ball Grid Array (eWLB) package," 2014 IEEE 64th Electronic Components and Technology Conference (ECTC), May 27-30, 2014, pp. 956-962 (See 4bstract).
Wojnowski, M. et al., "Embedded Wafer Level Ball Grid Array (eWLB) Technology for Millimeter-Wave Applications," Proc. IEEE 13th Electronics Packaging Technology Conference (EPTC2011), Singapore, Dec. 2011, pp. 423-429 (See Abstract).
International Search Report and Written Opinion for International Application No. PCT/EP2017/057743 dated Jul. 6, 2017.

* cited by examiner

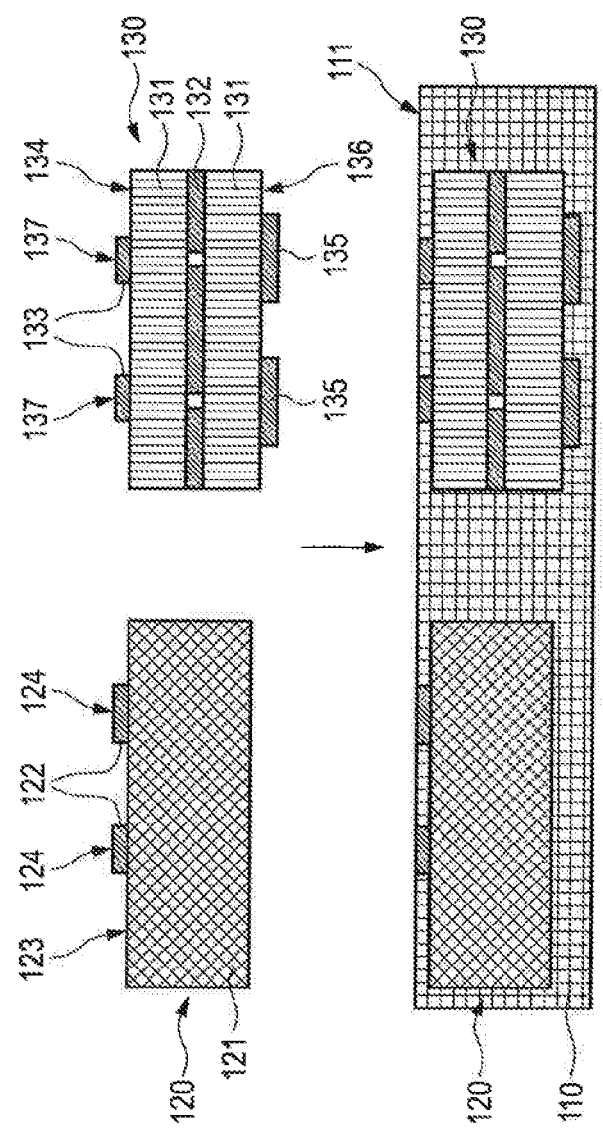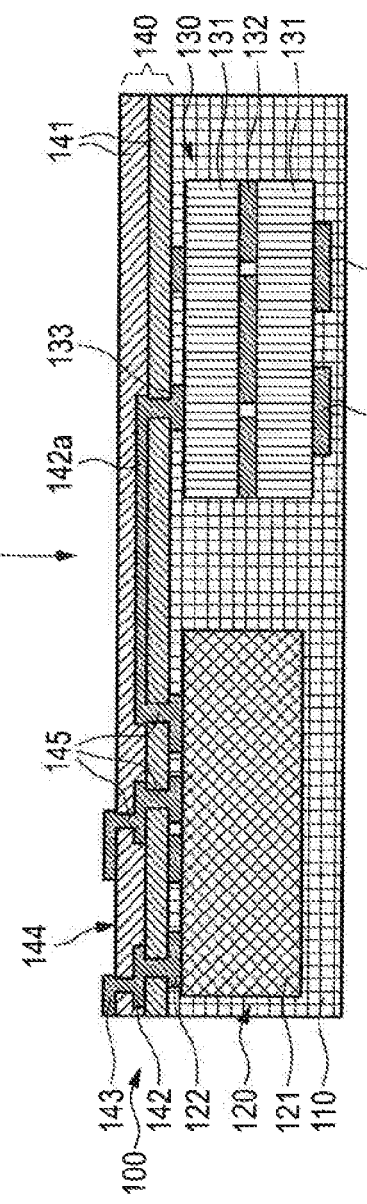

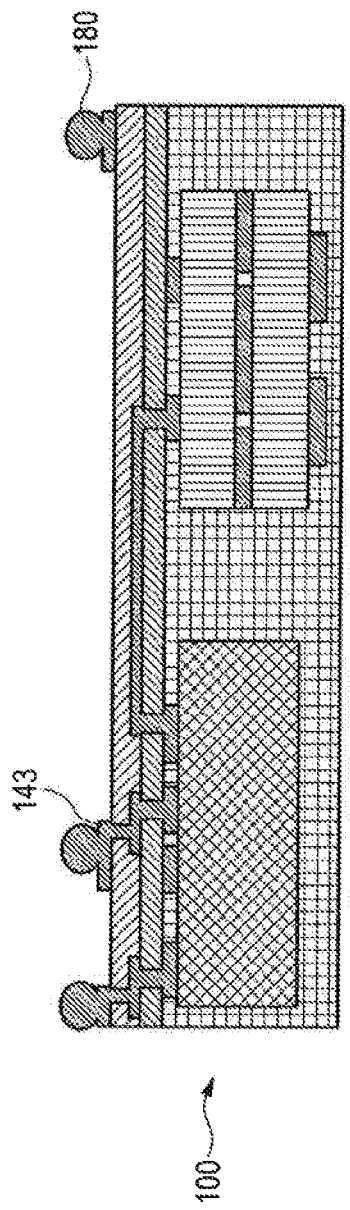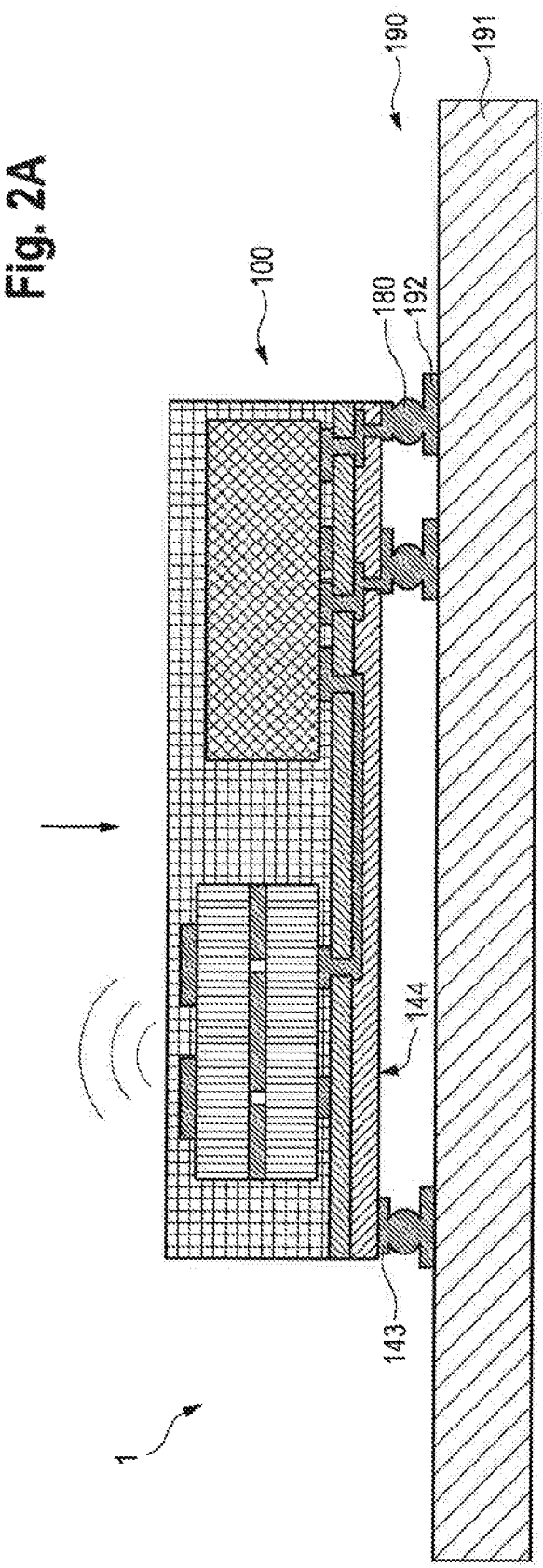

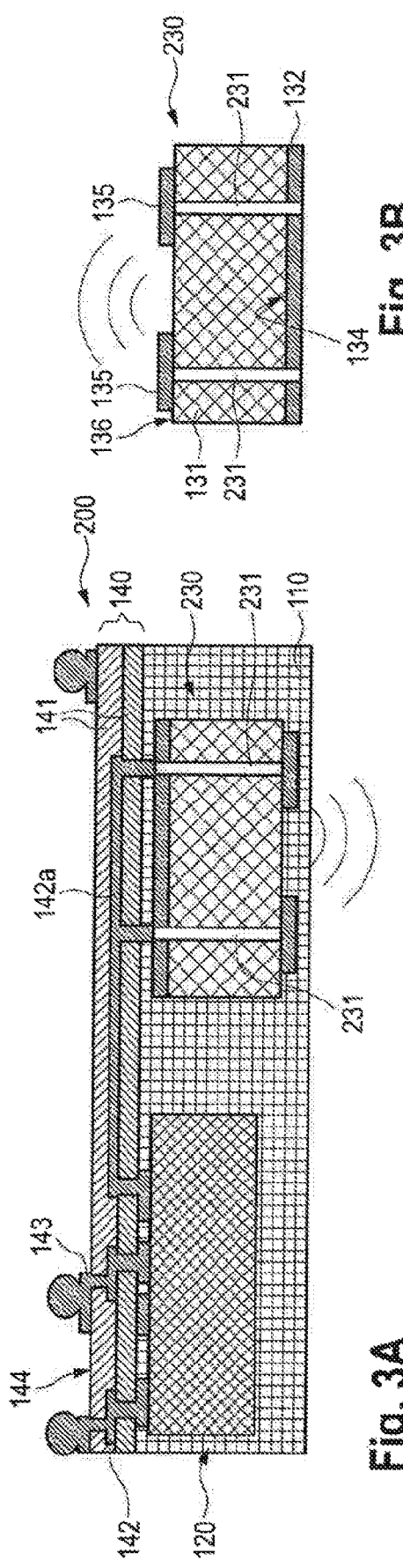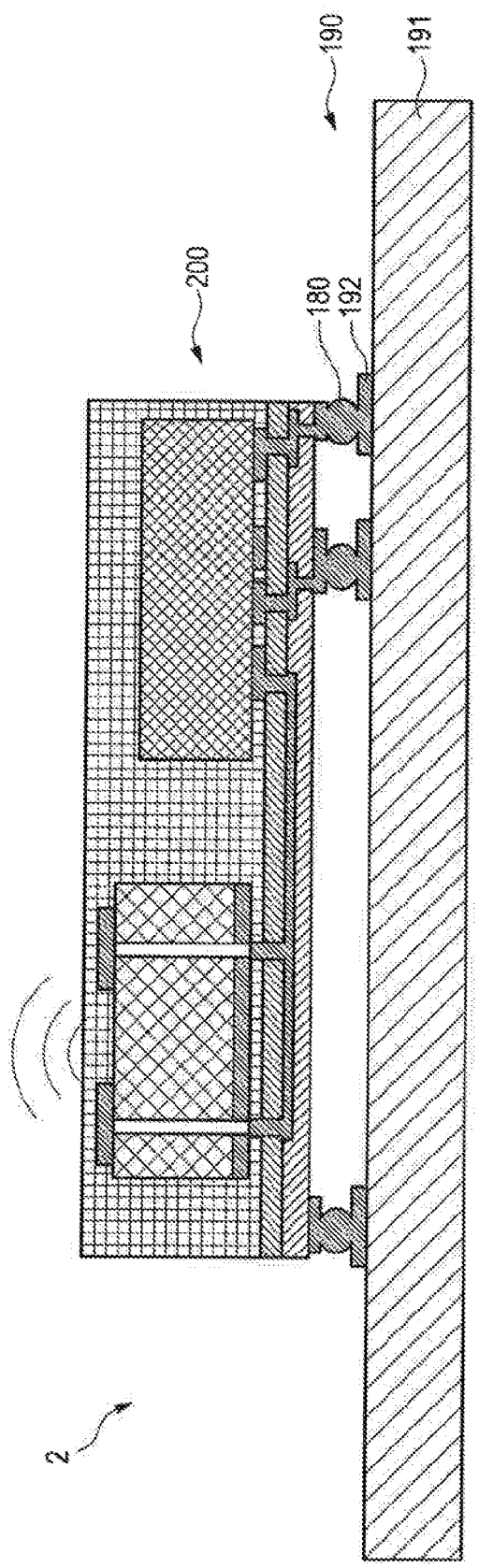

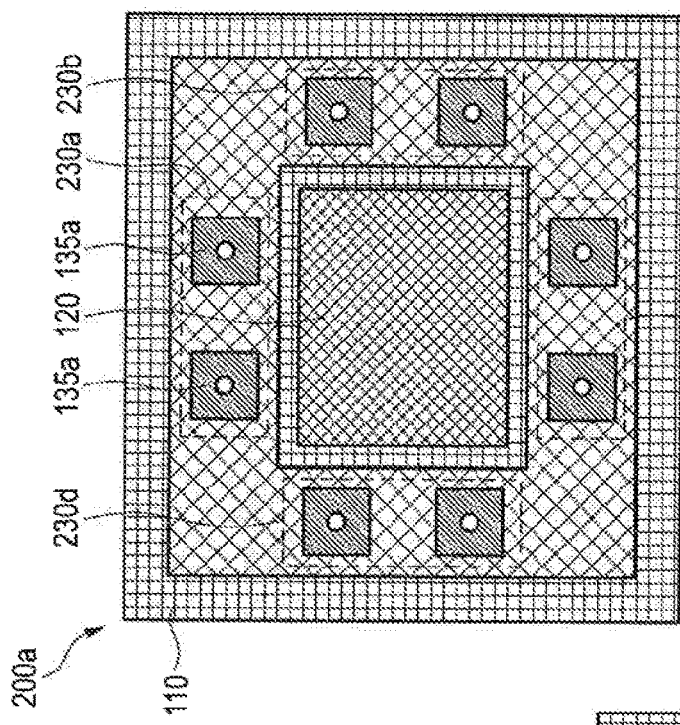
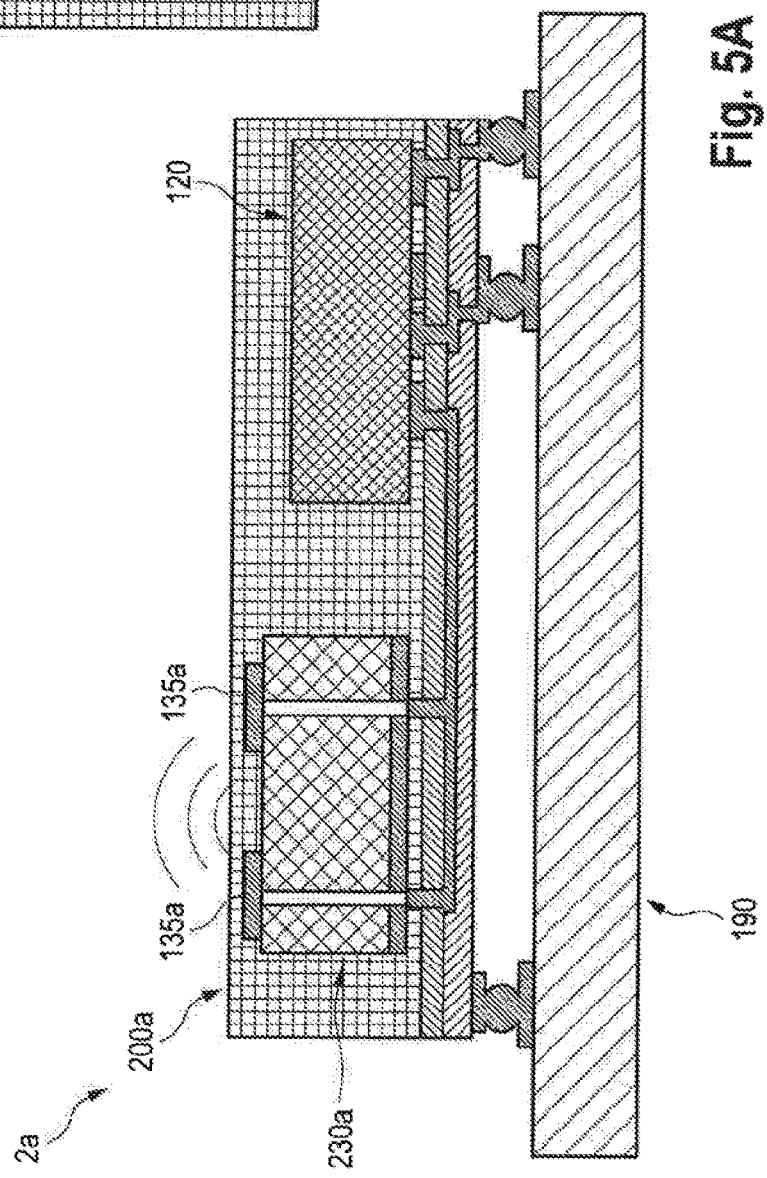
Fig. 5B
Fig. 5A

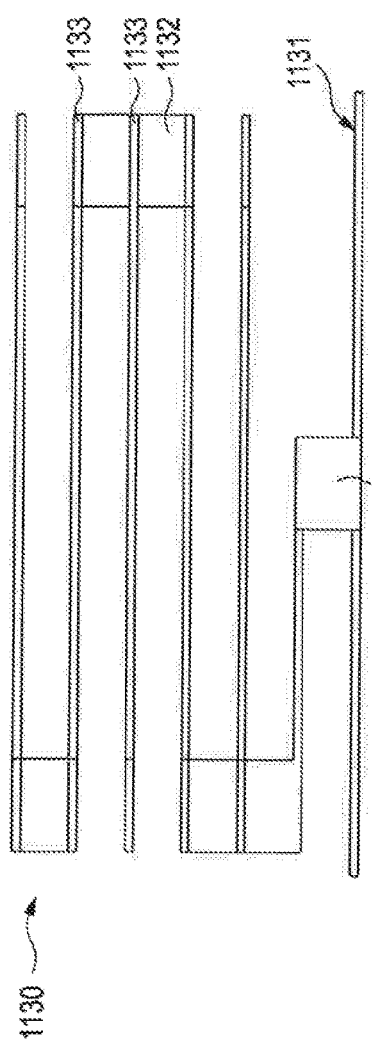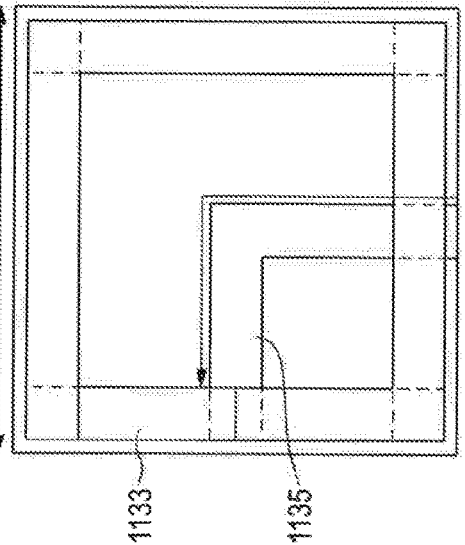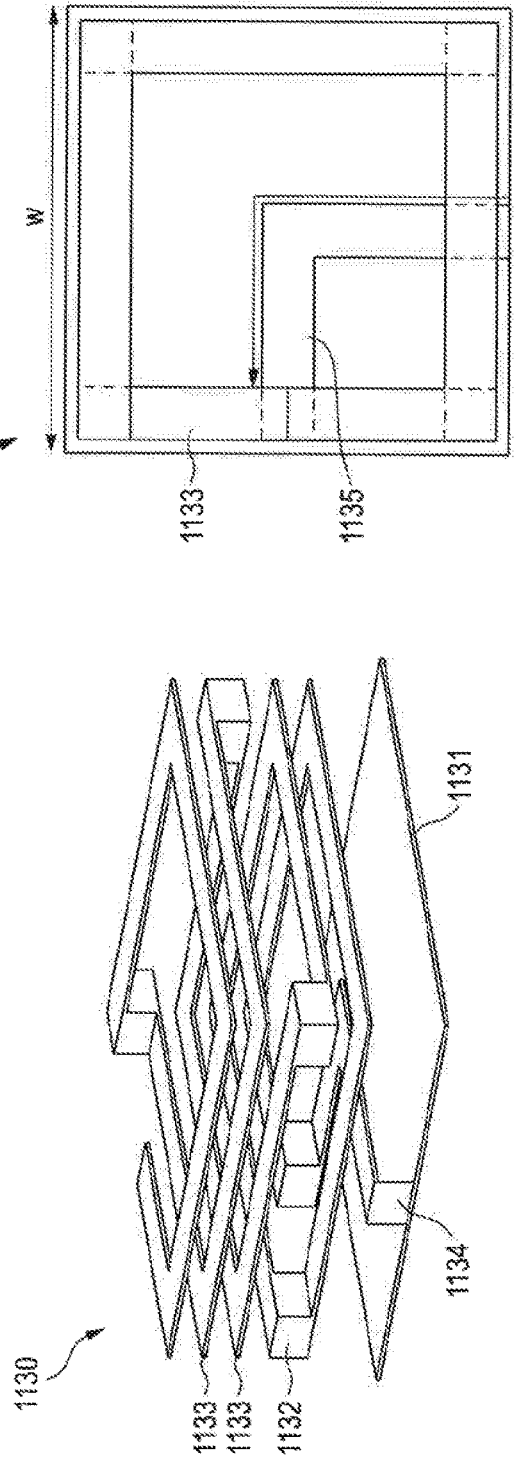

MICROWAVE ANTENNA APPARATUS, PACKING AND MANUFACTURING METHOD

BACKGROUND

Field of the Disclosure

The present disclosure relates to a microwave antenna apparatus, a microwave antenna package and a method of manufacturing a microwave antenna apparatus.

Description of Related Art

Fan-out wafer level packaging technology such as the embedded wafer-level ball grid array (eWLB) has matured for microwave and mm-wave radar and communication systems over the past years. This packaging technology is the first choice for low-cost system integration of MMICs, passives, and antennas into a single plastic type package. Many different types of planar antenna structures in fan-out wafer level packages have been published, e.g. in M. Wojnowski et al., "Embedded Wafer Level Ball Grid Array (eWLB) Technology for Millimeter-Wave Applications," Proc. IEEE 13th Electronics Packaging Technology Conference (EPTC2011), Singapore, pp. 423-429, December 2011. They all have in common, that the antenna elements are printed on one or more redistribution layers (RDLs). The disadvantage of the aforementioned solutions are their narrow operating bandwidth (1-5%), distorted radiation patterns due to thick mold compound in the radiating direction, and the high amount of parasitic radiation to all directions. Further, these planar antenna structures cannot provide enough gain for the long range and medium range radar applications without an additional apparatus.

E. Seler et al., "3D rectangular waveguide integrated in embedded Wafer Level Ball Grid Array (eWLB) package", Electronic Components and Technology Conference (ECTC), 2014 IEEE 64th, pp. 956-962, 27-30 May 2014 discloses a 3D rectangular waveguide in the fan-out area of an eWLB package using laminate inserts. To obtain the waveguide side walls in eWLB, an RF laminate with microvias is inserted in the fan-out area. The classical redistribution layer (RDL) on the one surface and an additional back side metallization on the other surface of the package are used to realize the top and bottom walls of the waveguide. In this paper, two different transition designs from redistribution layer to the SIW-type transmission lines are investigated in the package level. However, the antenna design is not emphasized. These SIW-type transmission lines are realized using RF laminates which are costly.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a microwave antenna apparatus and a microwave antenna package, which are radiation efficient and can be manufactured easier and more cost-efficient and is hence applicable as series product. Further, a corresponding method of manufacturing a microwave antenna apparatus shall be provided.

According to an aspect there is provided a microwave antenna apparatus comprising a mold layer of mold material, a semiconductor element comprising a semiconductor unit and semiconductor feed lines arranged on a first surface of the semiconductor unit, wherein the semiconductor element is arranged within the mold layer such that an outer surface of the semiconductor feed lines is not covered by mold material, an antenna element comprising an antenna substrate layer and a ground layer arranged on or within the antenna substrate layer, wherein the antenna element is arranged within the mold layer, and a redistribution layer comprising at least one redistribution substrate layer and a metal layer, wherein the redistribution layer is arranged on a surface of the mold layer such that the metal layer is in contact with the outer surface of one or more semiconductor feed lines, wherein a radiating element is arranged either on a second surface of the antenna substrate layer facing away from the redistribution layer or within or on the redistribution layer.

According to a further aspect there is provided a microwave antenna package comprising a PCB arrangement comprising a PCB layer and a microwave antenna apparatus as disclosed herein coupled to the PCB arrangement forming a fan-out wafer level package, such as an embedded wafer-level ball grid array, eWLB, or embedded micro-wafer-level-packaging, emWLP, package.

According to a further aspect there is provided a method of manufacturing a microwave antenna package comprising mounting a semiconductor element on a dummy carrier, the semiconductor element comprising a semiconductor unit and semiconductor feed lines arranged on a first surface of the semiconductor unit, mounting an antenna element on the dummy carrier, the antenna element comprising an antenna substrate layer and a ground layer arranged on or within the antenna substrate layer, covering the semiconductor element and the antenna element by a mold layer of mold material such that an outer surface of the semiconductor feed lines is not covered by mold material and that the antenna element is arranged within the mold layer, and replacing the dummy carrier by a redistribution layer, the redistribution layer comprising a redistribution substrate layer and a metal layer, wherein the redistribution layer is arranged on a surface of the mold layer such that the metal layer is in contact with the outer surface of one or more semiconductor feed lines, wherein a radiating element is arranged either on a second surface of the antenna substrate layer facing away from the redistribution layer or within or on the redistribution layer.

Preferred embodiments are defined in the dependent claims. It shall be understood that the disclosed microwave antenna apparatus, the disclosed microwave antenna packages and the disclosed method of manufacturing may all have similar and/or identical preferred embodiments as disclosed herein and as defined in the dependent claims.

According to the present disclosure different multi-layer antenna structures (such as an aperture coupled patch antenna) can be realized completely on a multi-layer substrate using PCB manufacturing process. The disclosed multi-layer antenna structures can be embedded in an eWLB or emWLP package. The antenna elements can be integrated into the microwave antenna apparatus by a standard pick and place process, which makes manufacturing easy and costeffective. Hence, one idea of this disclosure is to bypass the degrading effect of the mold compound using an SMT-type microwave antenna apparatus.

It shall be understood that according to the present disclosure the antenna may be used generally in the frequency range of millimeter waves and microwaves, i.e. in at least a frequency range from 3 GHz to 3 THz, in particular above 30 GHz. The "operating frequency" may generally be any frequency within this frequency range. When using the term "microwave" and/or "mm-wave" herein any electromagnetic radiation within this frequency range shall be understood. Within this frequency range, the antennas are fitting into eWLB packages due to their size, ranging from cm to mm range. The antenna size is dependent on the operating frequency.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein:

FIG. 1 shows a cross-sectional view of a first embodiment of a microwave antenna apparatus according to the present disclosure and two interstage products in the manufacturing process, FIG. 2 shows a cross-sectional view of a first embodiment of a microwave antenna package according to the present disclosure and one interstage product in the manufacturing process, FIG. 3 shows a cross-sectional view of a second embodiment of a microwave antenna apparatus, an embodiment of the integrated antenna element and a second embodiment of a microwave antenna package according to the present disclosure, FIG. 5 shows a cross-sectional view and a top view of a fourth embodiment of a microwave antenna package including a fourth embodiment of a microwave antenna apparatus according to the present disclosure FIG. 20 shows different views of a helical antenna for use in a microwave antenna apparatus according to the present disclosure.

DETAILED DESCRIPTION OF THE EMBODIMENTS

Figure 4B:
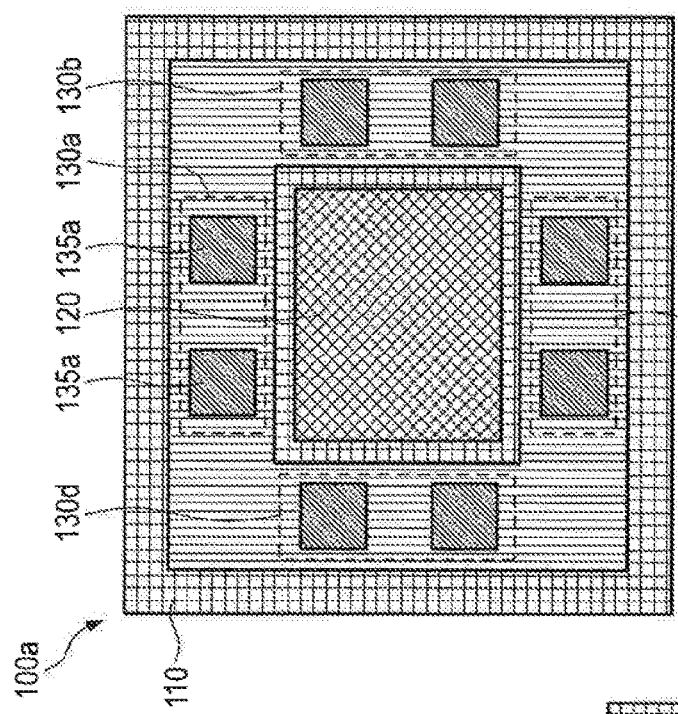
FIG. 4 shows a cross-sectional view and a top view of a embodiment of a microwave antenna package including a third embodiment of a microwave antenna apparatus according to the present disclosure.

Referring now to the drawings, wherein like reference numerals designate identical or corresponding parts throughout the several views, FIG. 1 shows a cross-sectional view of a first embodiment of a microwave antenna apparatus 100 (FIG. 1C) according to the present disclosure and two interstage products (FIGS. 1A and 1B) in the manufacturing process.

The microwave antenna apparatus 100 comprises a mold layer 110 of mold material, a semiconductor element 120, an antenna element 130 and a redistribution layer 140. The semiconductor element 120 comprises a semiconductor unit 121 and semiconductor feed lines 122 arranged on a first surface 123 of the semiconductor unit 121. The semiconductor element 120 is arranged within the mold layer 110 such that an outer surface 124 of the semiconductor feed lines 122 is not covered by mold material. The antenna element 130 comprises an antenna substrate layer 131 and a ground layer 132 (also called ground plane) arranged on or within the antenna substrate layer 131. The antenna element 130 is arranged within the mold layer 110 as well. The redistribution layer 140 comprises at least one redistribution substrate layer 141 (in this embodiment two redistribution substrate layers 141 on top of each other to provide a better stability and avoid warpage (a phenomena that bends the mold compound by temperature change; if warpage occurs, there is no stability anymore) and oxidation (occurring when a metal layer, e.g. made of copper, has contact with air); however, the number of redistribution substrate layers is not limited to one or two) and a metal layer 142. The redistribution layer 140 is arranged on a surface 111 of the mold layer 110 and configured such that the metal layer 142 is in contact with the outer surface 124 of one or more semiconductor feed lines 122.

The antenna element 130 comprises one or more antenna feed lines 133 (representing a feeding network) arranged on a first surface 134 of the antenna substrate layer 131 opposite the second surface 136. A radiating element 135 is arranged on a second surface 136 of the antenna substrate layer 131 facing away from the redistribution layer 140. T the antenna element 130 is arranged within the mold layer 110 such that an outer surface 137 of the antenna feed lines 133 is not covered by mold material.

The redistribution layer 140 is arranged on the surface 111 of the mold layer 110 such that the metal layer 142 is in contact with the outer surfaces 137 of one or more antenna feed lines 133 for providing the RF coupling between the semiconductor element 120 and the antenna element 130. The redistribution layer 140 further comprises an under bump metallization layer 143 on a surface 144 of the redistribution layer 140 facing away from the mold layer 110, said under bump metallization layer 143 being provided for being contacted with strip lines of a PCB arrangement when forming a microwave antenna package by placing the microwave antenna apparatus 100 on the PCB arrangement, as will be explained below. Vias or other connection elements 145 are provided in the redistribution layer 140 to provide connections between the semiconductor feed lines 122 with the metal layer 142 and between the metal layer 142 and the under bump metallization layer 143.

The antenna element 130 is preferably configured as an SMD (surface-mount device) component. An SMD component is an electronic device using surface-mount technology (SMT), which is a method for producing electronic circuits. The use of an SMD component enables that, for forming the first interstage product shown in FIG. 1A, the antenna element 130 and the semiconductor element 120 are handled as separate elements by a pick and place process by a pick and place machine as used for other passive surface mounted devices such as resistors or capacitors. Here, they are placed on a dummy carrier (not shown in FIG. 1A).

The dummy carrier thus contacts the outer surface 124 of the semiconductor feed lines 122 and the outer surface 137 of the antenna feed lines 133. Afterwards, the mold material is placed over the first interstage product, whereafter the dummy carrier is removed to form the second interstage product shown in FIG. 1B. By use of the dummy carrier it can thus be ensured that the outer surface 124 of the semiconductor feed lines 122 and the outer surface 137 of the antenna feed lines 133 are not covered by mold material. Finally, the redistribution layer 140 is formed on top of the second interstage product to form the microwave antenna apparatus 100 shown in FIG. 1C.

FIG. 2 shows a cross-sectional view of a first embodiment of a microwave antenna package 1 according to the present disclosure and one interstage product in the manufacturing process. FIG. 2 shows particularly how the microwave antenna apparatus is placed on a PCB (printed circuit board) arrangement 190 comprising a PCB layer 191 to form a fan-out wafer level package, in particular an embedded wafer-level ball grid array, eWLB, or embedded microwafer-level-packaging, emWLP, package. This process may be performed by the manufacturer or the end user. In this process solder balls 180 are placed on the outer surface of the under bump metallization layer 143 to form a third interstage product. Thereafter, the third interstage product is soldered onto the PCB arrangement 190, which has strip lines 192 on the PCB layer 191 corresponding to the under bump metallization layer 143 and the solder balls 180, thus arriving at the final microwave antenna package 1.

Thus, as explained above, in order to integrate antenna functionality into such a microwave antenna package (e.g. an eWLB package or an emWLB package), different multi-layer antenna structures (such as an aperture coupled patch antenna or a dipole antenna) can be realized completely on a multi-layer substrate using standard PCB manufacturing process. The fabrication and integration concepts are shown in FIGS. 1 and 2. This configuration will allow developing radiation efficient antennas with adequate distance between the radiating element 136 and the ground plane 132. Moreover, using this approach, the feed network 137 can also be patterned on one of the multi-layer antenna structure as shown in FIGS. 1 and 2. By using RDLs (redistribution layers), the contact between the antenna element 130 and the semiconductor element (chip) 120 can be established as shown in FIGS. 1 and 2.

Radiation takes place from the top side of the flipped microwave antenna package. The antenna substrate layer 131 used to develop the multi-layer antenna structure may be made of a microwave material, or of a BT, FR4 or FR408 type substrate material, or of ceramics, or of Rogers substrate material, of PTFE (Teflon), or of a mold type material, or of LTCC, or of LCP. Since microwave substrate is expensive if compared to FR 4, a low-cost solution could be to develop the antenna module using FR 4 or FR 408. Using FR 4 substrate will allow an easily realization of low-cost multi-layer structures as fabrication of multi-layer FR4 is a standard process. FR 4 and FR 408 can also be used for mm-wave applications provided the length of transmission lines are kept smaller.

Another concept includes the use of mold compound as antenna substrate of the microwave antenna apparatus 200, which is then embedded into the microwave antenna package 2 as illustrated in FIG. 3. FIG. 3 particularly shows a cross-sectional view of a second embodiment of a microwave antenna apparatus 200 (FIG. 3A), an embodiment of the integrated antenna element 230 (FIG. 3B) and a second embodiment of a microwave antenna package 2 (FIG. 3C) according to the present disclosure. This will be a low-cost option as microwave substrates are relatively expensive if compared to epoxy mold compound. The performance may not be as good as compared to the performance of the antennas on organic materials but this will also reduce the cost to some extent.

In this embodiment the antenna element 230 comprises one or more connection lines 231 connecting the coupling portion 142*a* (coupling the semiconductor element 120 to the antenna element 230) of the metal layer 142 with the radiating element 135, which is arranged on the second surface 136 of the antenna substrate layer 131, through the substrate layer 131 for direct signal transfer.

Figure 4A:
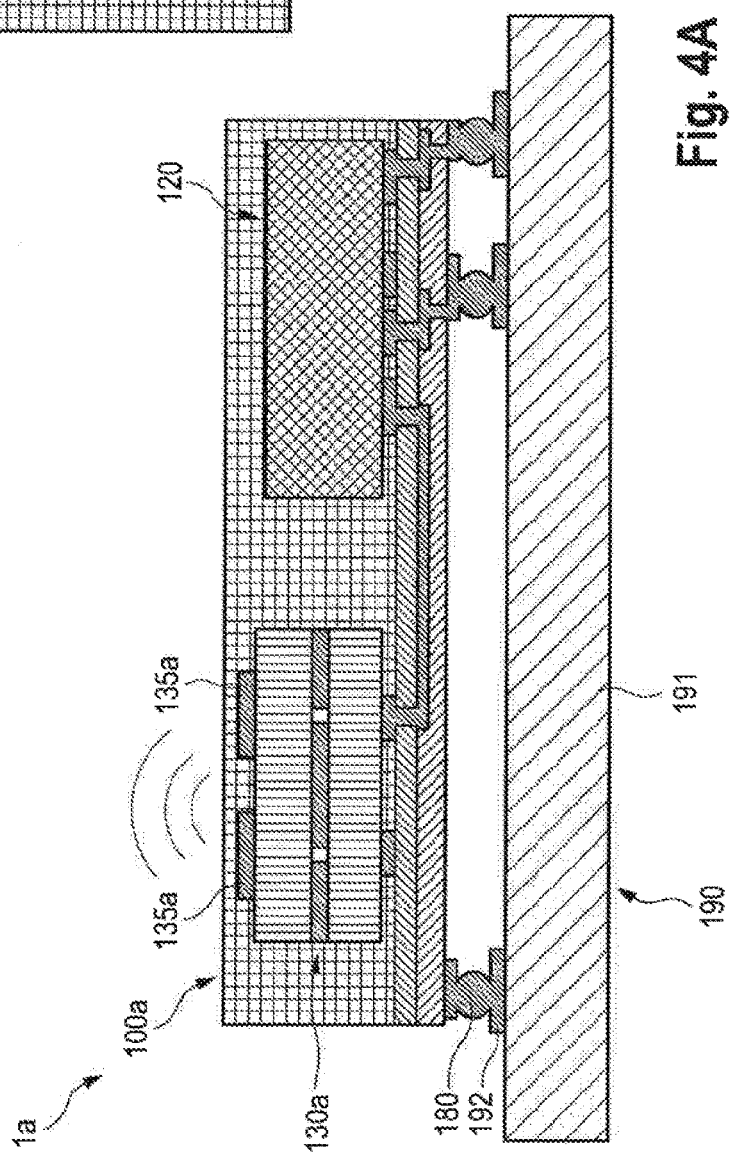

FIG. 4 shows a cross-sectional view (FIG. 4A) and a top view (FIG. 4B) of a embodiment of a microwave antenna package 1*a* including a third embodiment of a microwave antenna apparatus 100*a* according to the present disclosure. As shown in FIG. 4, a multi-layer PCB (configured as antenna module) can be placed into mold compound into the eWLB package 1*a* like an SMT component. Since the antennas in the redistribution layer 140 may be inefficient due to existing mold compound, the use of multi-layer PCB or epoxy mold can bypass these problematic zones with minimum radiation loss and parasitic radiations. As a multi-layer PCB, even a low-cost FR4 can be used for cost-optimization since the feed lines are short enough. The antennas can also be isolated from each other by using multiple ground vias around the antenna structures.

As shown in the top view of FIG. 4B multiple antenna elements 130a, 130b, 130c, 130d are arranged within the mold layer 110 around the semiconductor element 120. Such an embodiment is particularly useful for forming a MIMO antenna or a radar antenna.

FIG. 5 shows a cross-sectional view (FIG. 5A) and a top view (FIG. 5B) of a fourth embodiment of a microwave antenna package 2a including a fourth embodiment of a micro-wave antenna apparatus 200a according to the present disclosure. This embodiment is very similar to the embodiment shown in FIG. 4, but the antenna elements 230a, 230b, 230c, 230d arranged around the semiconductor element 120 are configured as shown in FIG. 3.

Figure 6:
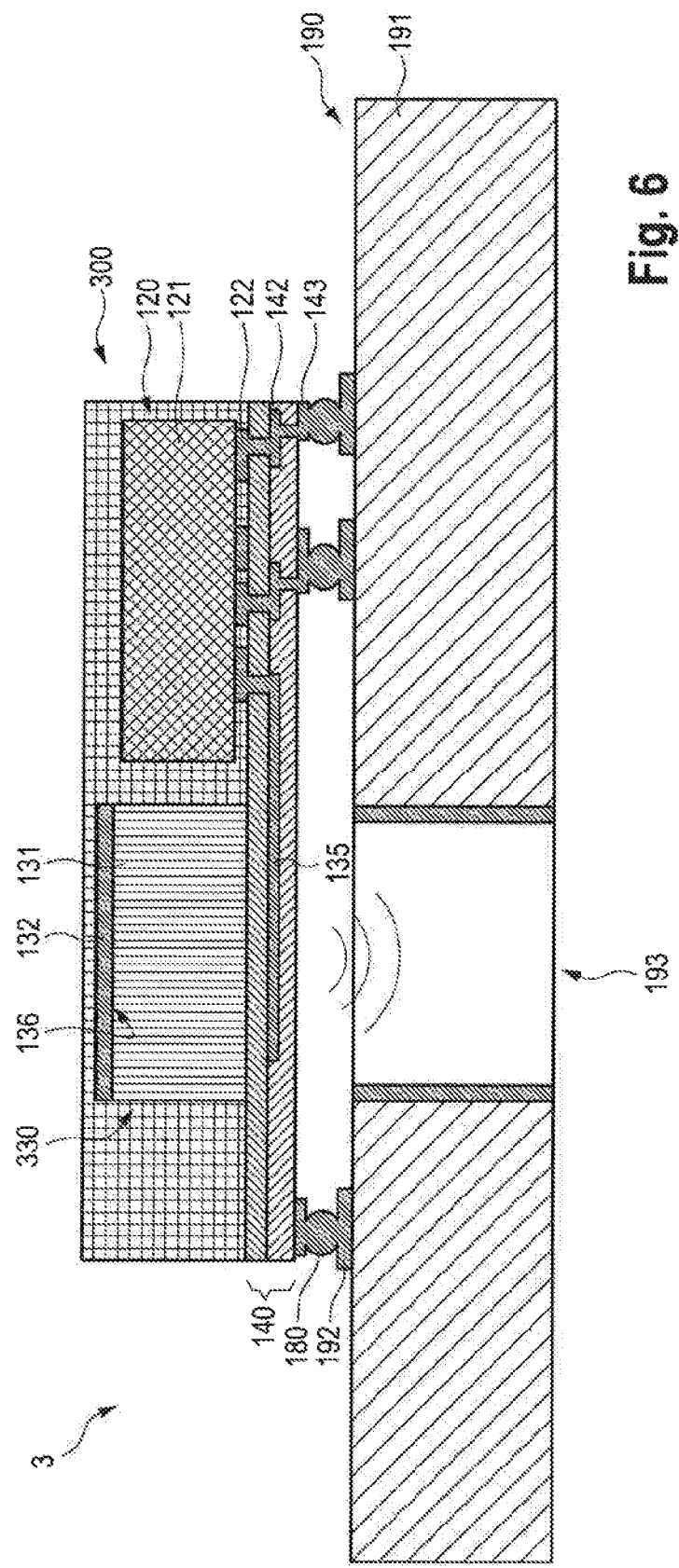
FIG. 6 shows a cross-sectional view of a fifth embodiment of a microwave antenna package including a fifth embodiment of a microwave antenna apparatus according to the present disclosure.

FIG. 6 shows a cross-sectional view of a fifth embodiment of a microwave antenna package 3 including a fifth embodiment of a microwave antenna apparatus 300 according to the present disclosure. This embodiment realizes waveguide based antennas. The radiating element 135 of the antenna element 330 is realized in the RDL 140 and the ground plane 132 is placed on a microwave or FR 4 substrate 131 that can be placed in the encapsulant (i.e. into a mold compound) by a pick and place process. The energy is then coupled to the waveguide 193 fabricated in the PCB layer 191. The configuration shown in FIG. 6, will have a radiation-efficient excitation of the waveguide 193, which will improve the radiation efficiency and performance issues of antennas realized in RDLs (with ground plane on PCB or RDL).

Figure 7:
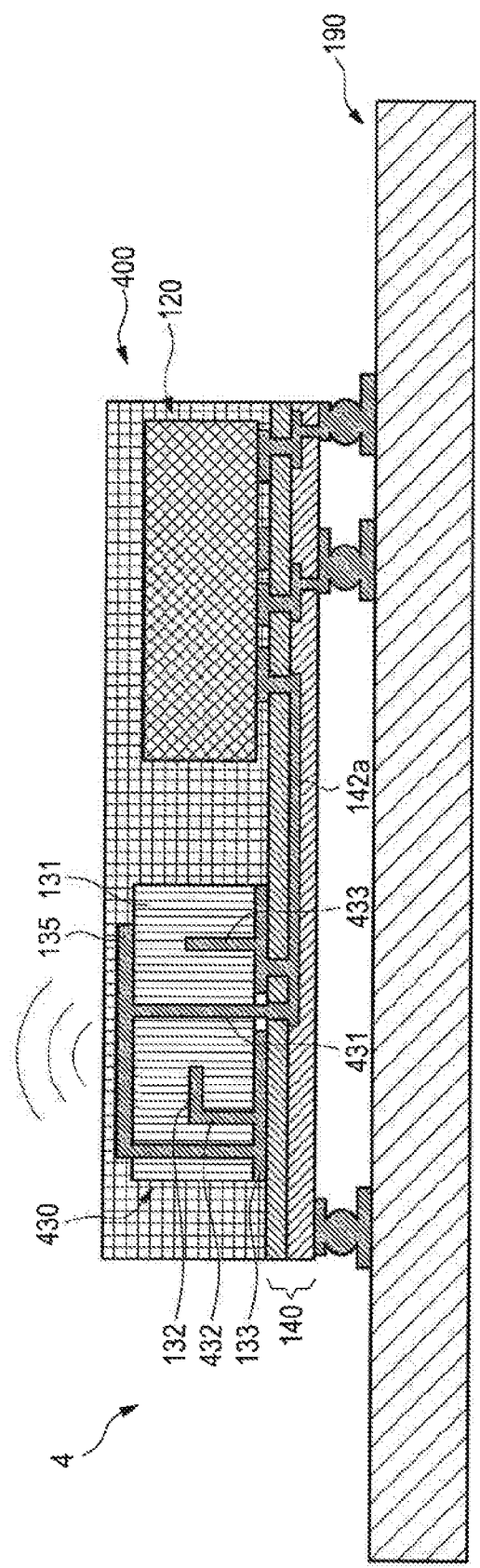
FIG. 7 shows a cross-sectional view of a sixth embodiment of a microwave antenna package including a sixth embodiment of a microwave antenna apparatus according to the present disclosure.

FIG. 7 shows a cross-sectional view of a sixth embodiment of a microwave antenna package 4 including a sixth embodiment of a microwave antenna apparatus 400 according to the present disclosure. This embodiment makes use of a Planar Inverted F-type Antenna (PIFA) in the antenna element 430 realized either on microwave substrates or on FR4 or FR408 substrates. PIFA antennas are normally used in mobile communication devices and their use has been limited at lower frequencies (<6 GHz). Low bandwidth and less gain are some of the major concerns of this antenna which restricts its usage to limited applications. The bandwidth can be enhanced by tuning the width of the shorted plate and feeding plate. Moreover, by adding rectangular and L-shaped parasitic elements 431 additional resonances can be created which can increase the overall antenna bandwidth.

Hence, different from other embodiments, in this embodiment the antenna element 430 comprises one or more connection lines 431 connecting one or more antenna feed lines 133 with the radiating element 13) through the substrate layer 131. Further, one or more parasitic elements 432 are arranged within the antenna substrate layer 131 between the ground layer 132 arranged within the antenna substrate layer 131 and one or more antenna feed lines 133.

PIFA antennas are $\lambda/4$-long antennas which make them significantly compact and if designed and realized properly may be used in a radar module in significantly small form factor. PIFA antennas may e.g. be provided on FR 4 or FR 408 Rogers substrate (PTFE-based) using the antenna configuration concept as depicted in FIG. 7.

Figure 8:
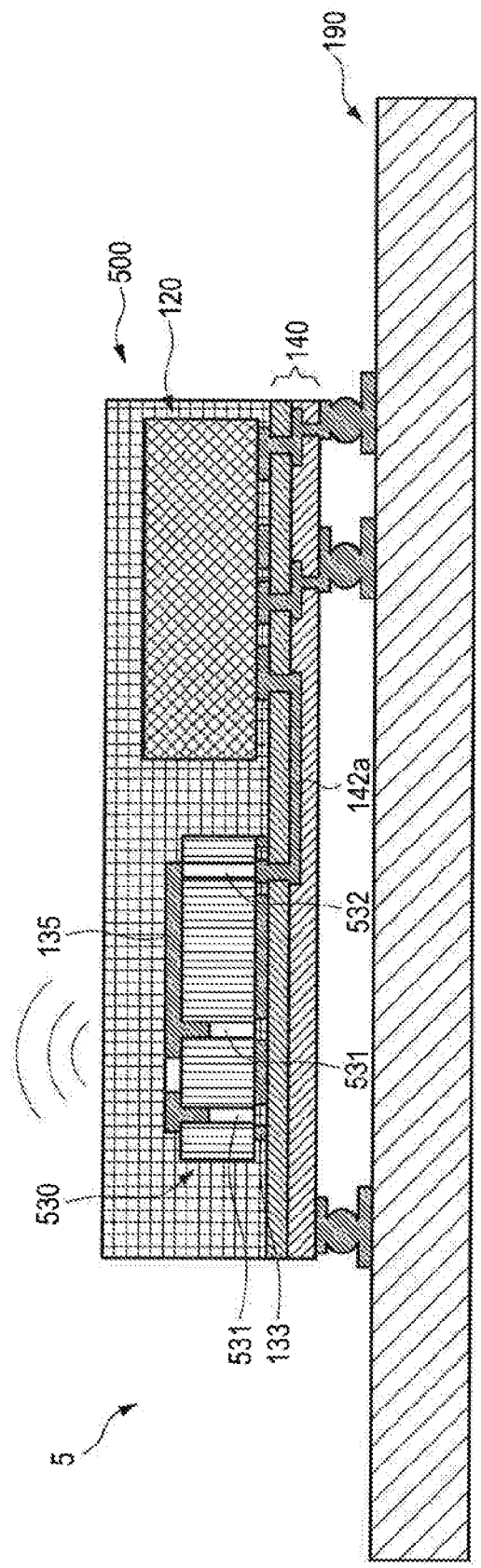
FIG. 8 shows a cross-sectional view of a seventh embodiment of a microwave antenna package including a seventh embodiment of a microwave antenna apparatus according to the present disclosure.

FIG. 8 shows a cross-sectional view of a seventh embodiment of a microwave antenna package 5 including a seventh embodiment of a microwave antenna apparatus 500 according to the present disclosure. This embodiment uses a substrate-integrated waveguide-based (SIW-based) antenna element 530, using any one of the antenna configuration concepts shown in FIGS. 1 to 4. Integration of SIW structures in eWLB technology is generally known, but an integration of SIW based antennas in eWLB technology has not been used yet. The advantage of SIWs compared to patch antennas is their larger operating bandwidths.

In this embodiment the antenna element 530 comprises one or more connection lines 531 (also called ground vias) connecting one or more antenna feed lines 133 with the radiating element 135 through the substrate layer 131 and one or more vias 532 connecting the metal layer 142 with the antenna element 135 acting as feed line for transferring the feeding signal and couple it into the SIW.

Figure 9:
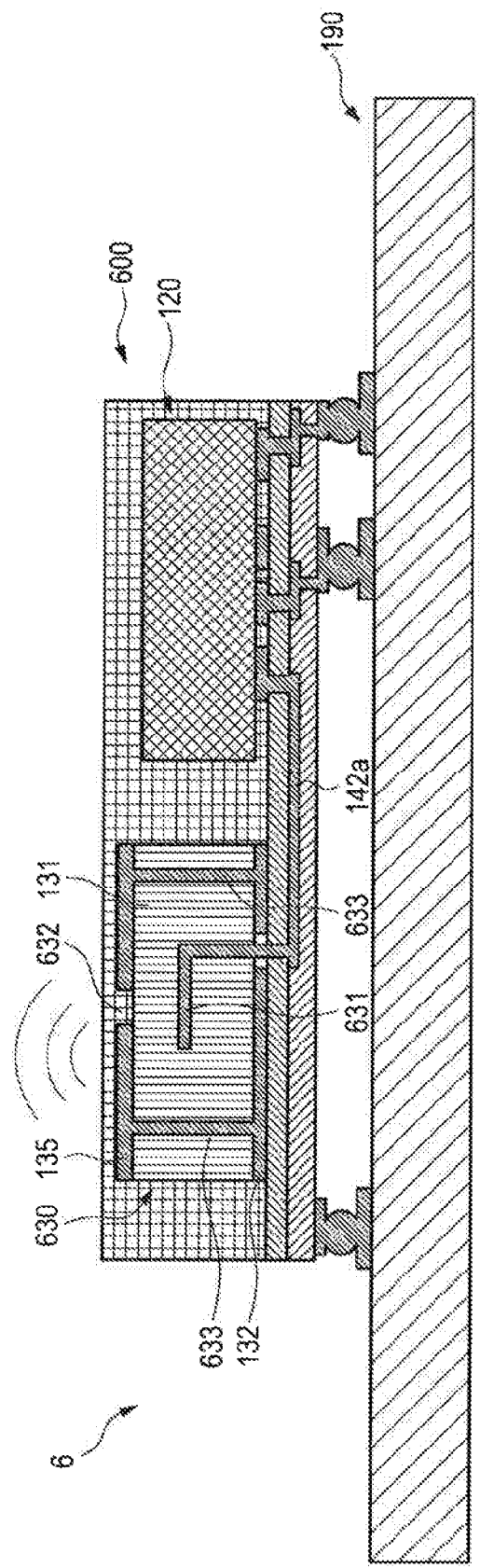
FIG. 9 shows a cross-sectional view of an eighth embodiment of a microwave antenna package including an eighth embodiment of a microwave antenna apparatus according to the present disclosure.

FIG. 9 shows a cross-sectional view of an eighth embodiment of a microwave antenna package 6 including an eighth embodiment of a microwave antenna apparatus 600 according to the present disclosure. In this embodiment the antenna element 630 comprises one or more connection lines 633 connecting the ground layer 132, which is arranged on the first surface 134 of the antenna substrate layer 131 opposite the second surface 136, with the radiating element 135, which is arranged on the second surface 136 of the antenna substrate layer 131, through the substrate layer 131. Further, the antenna element 630 comprises a micro-coaxial transmission line 631 arranged within the antenna substrate layer 131 and connected to the metal layer 142.

This embodiment thus provides a very promising transmission line in the form of a micro-coaxial transmission line 631 which exhibits extremely low loss simulated performance (less than 0.25 dB/mm of insertion loss up to 200 GHz). This transmission line 631 can be used to feed the antenna comprising a hole 632 in the radiating element 135 through which the radiation is emitted. Since the signal conductor is covered by via-wall 633 on the sides and metal planes 132, 135 on the top and bottom sides, this type of transmission lines 631 are also desirable where coupling between two transmission lines shall be avoided.

Figure 10:
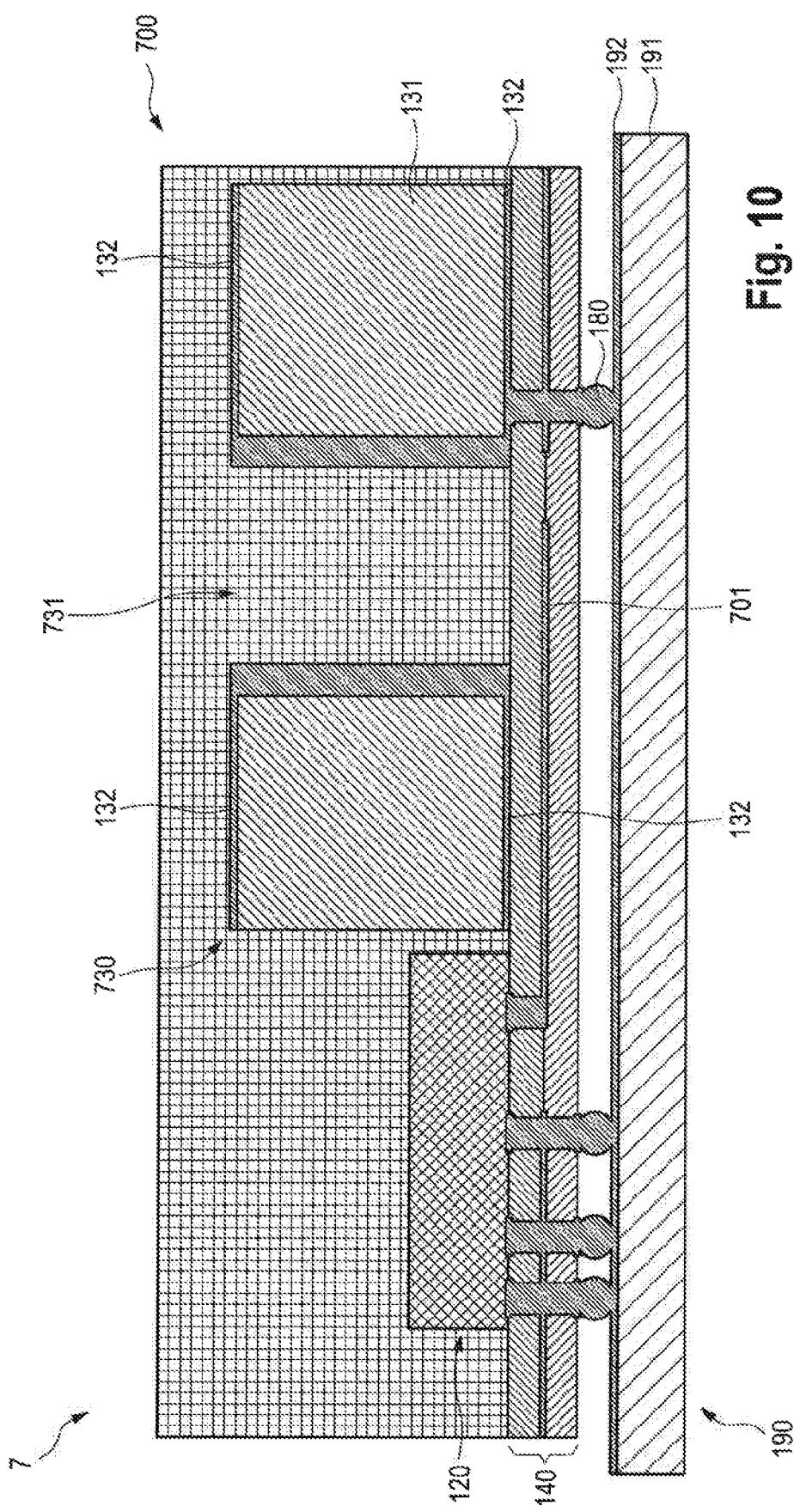
FIG. 10 shows a cross-sectional view of a ninth embodiment of a microwave antenna package including a ninth embodiment of a microwave antenna apparatus according to the present disclosure.

FIG. 10 shows a cross-sectional view of a ninth embodiment of a microwave antenna package 7 including a ninth embodiment of a microwave antenna apparatus 700 according to the present disclosure. The antenna element 730 comprises an open ended waveguide structure 731 and the radiating element comprises a waveguide feed 701 arranged in or on the redistribution layer 140 opposite the open ended waveguide structure 731.

Hence, this embodiment uses vias inside low-cost laminate to realize open ended circular waveguide antennas inside an eWLB package. A PCB including vias is placed inside the eWLB package. Additional metallization layers 132 on top and bottom can be employed for shielding purposes or improved radiation properties. Millimeter wave transmission lines are designed on the redistribution layer 140 to feed the circular waveguide 731. The waveguide feed 701 is designed to excite appropriate TE or TM modes. The diameter of the vias is chosen to support the excited waves. The waveguide structure 731 can be either rectangular or cylindrical. Due to cost issues cylindrical vias are the preferred solution. The waveguide structure 731 can also be referred to as a horn antenna.

Figure 11:
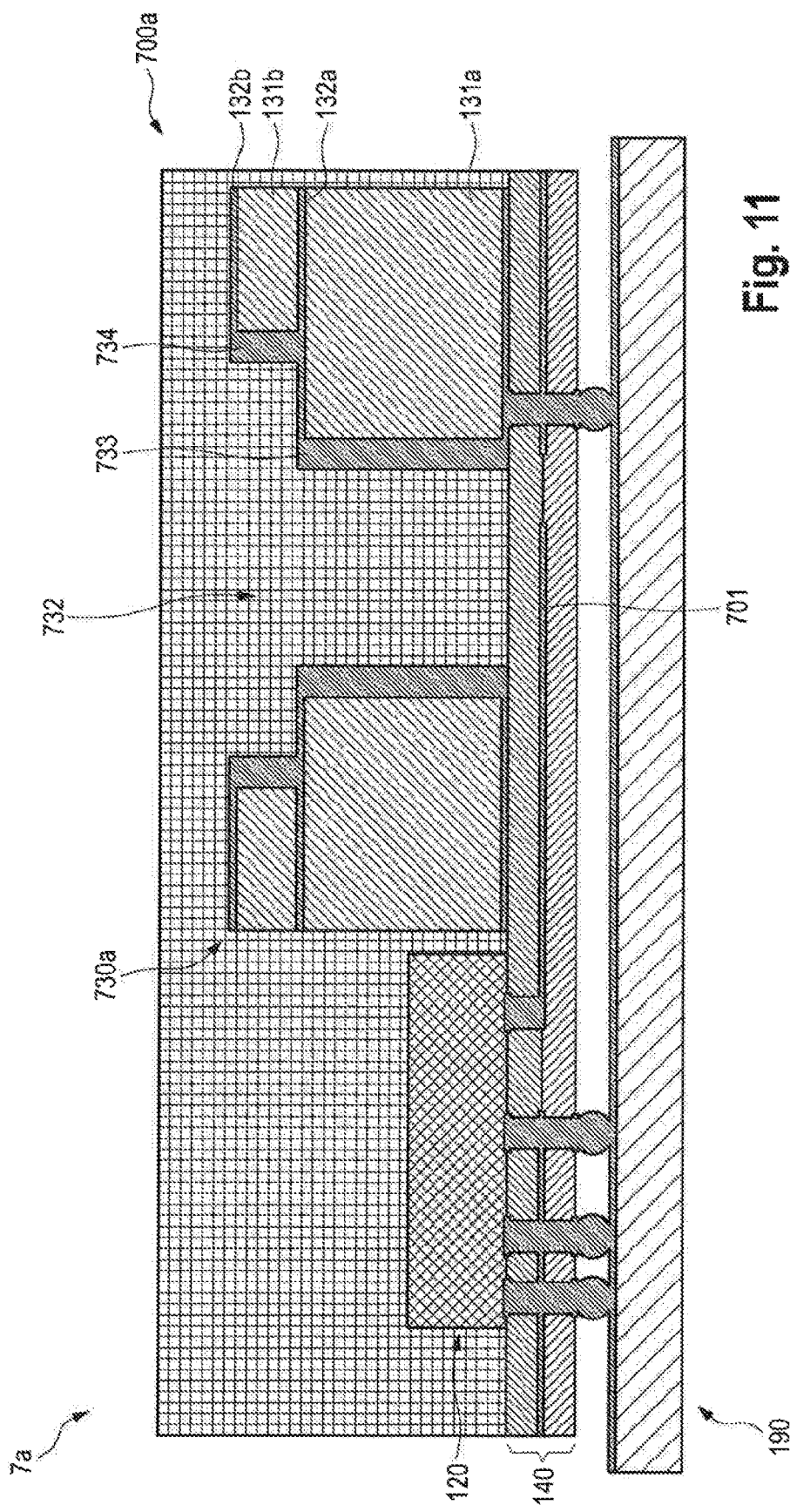
FIG. 11 shows a cross-sectional view of a tenth embodiment of a microwave antenna package including a tenth embodiment of a microwave antenna apparatus according to the present disclosure.

FIG. 11 shows a cross-sectional view of a tenth embodiment of a microwave antenna package 7a including a tenth embodiment of a microwave antenna apparatus 700a according to the present disclosure. In this embodiment multilayer laminates are employed to design circular waveguide horn antennas 730a. As an example, a PCB with two substrates 131a, 131b with respective ground layers 132a, 132b is used as depicted in FIG. 11. The vias 733, 734 in both substrates are located at the same position. However, the via 734 in the second substrate 131b has a larger diameter. This concept can be easily enhanced to multiple layers. Hence, the substrate based antenna apparatus 700a correspond to the conventional design of a three-dimensional circular horn antenna.

Figure 12A:
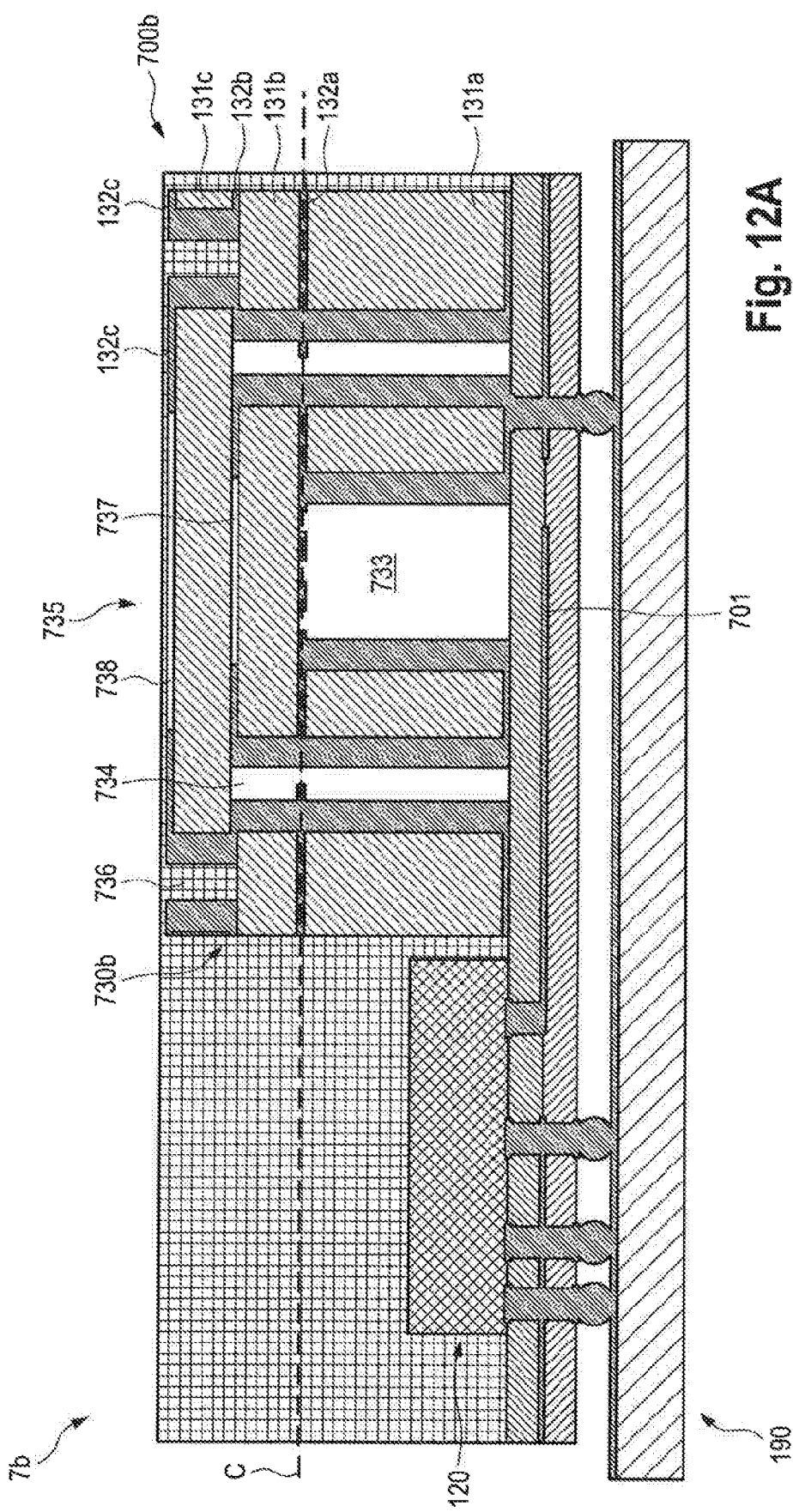
FIG. 12 shows a cross-sectional view and a top view of an eleventh embodiment of a microwave antenna package including an eleventh embodiment of a micro-wave antenna apparatus according to the present disclosure.
Figure 12B:
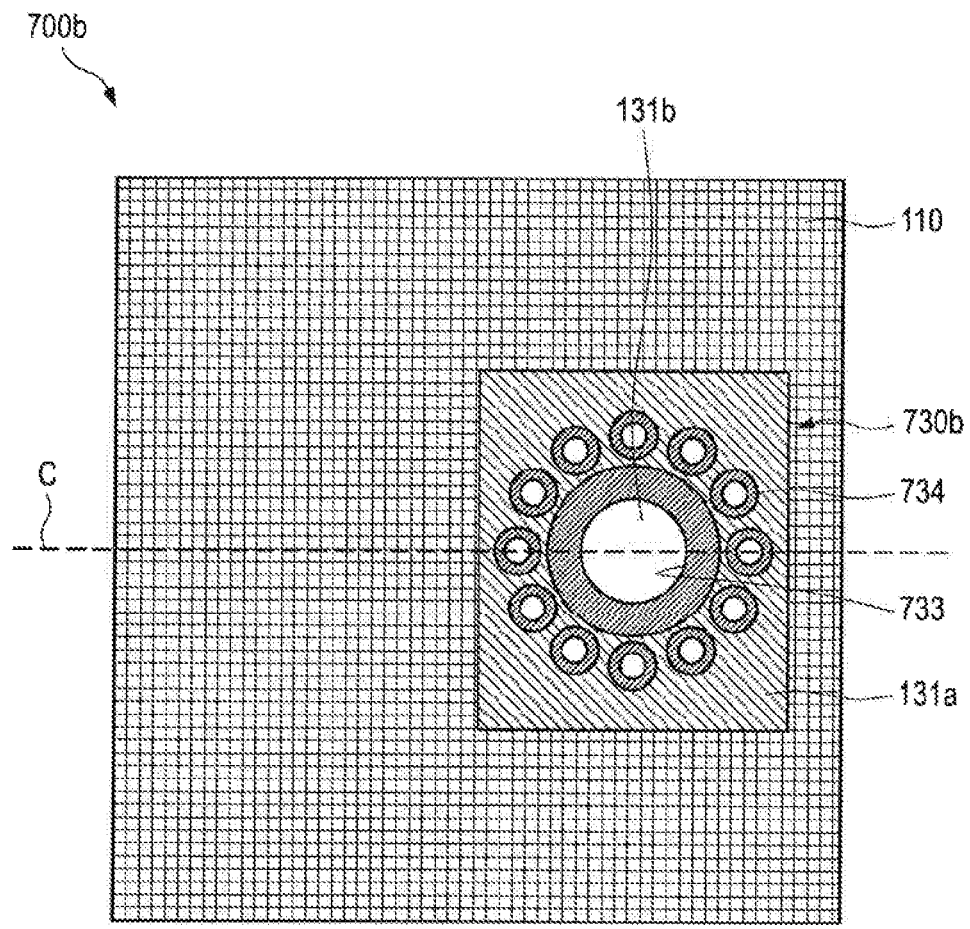

FIG. 12 shows a cross-sectional view (FIG. 12A) and a top view (FIG. 12B) of an eleventh embodiment of a microwave antenna package 7b including an eleventh embodiment of a micro-wave antenna apparatus 700b according to the present disclosure. In this embodiment a corrugated circular horn antenna 730b and antenna aperture optimization is achieved by utilizing vias 733, 734, 736 with increasing diameter for the different substrates 131a, 131b, 131c on which ground planes 132a, 132b, 132c are provided, together forming a waveguide 735 with corrugations. The vias 733, 734, 736 are surrounded by the ground planes 132b and 132c. Circular holes 737, 738 are edged inside the ground planes 132b, 132c to achieve the corrugated horn antenna shape. The corrugations (grooves) are thus formed by combining enhanced ground planes 132b, 132c and the vias 733, 734, 736. The corrugations have a dimension of $\lambda/2 > b > \lambda/4$, where $\lambda = c_0/f_4$ ($c_0$ being the speed of light and $f_4$ being the operating frequency of the antenna). Quarterwave or halfwave grooves are formed by holes with dedicated diameters inside the ground planes and vias. The combination of large and small vias can also be employed to optimize the radiating part of the substrate based circular horn antenna. To illustrate the dimensions and location of the vias a top view of the cutting plane C of FIG. 12A is shown in FIG. 12B. The vias 733 with small diameter are placed around the circular waveguide 735 inside substrate 131a.

An additional flare may be formed by combining via and ground arrangements shown in FIGS. 11 and 12. The aperture of the antenna is increased leading to more directive radiation patterns which are required by modem radar applications.

Figure 13A:
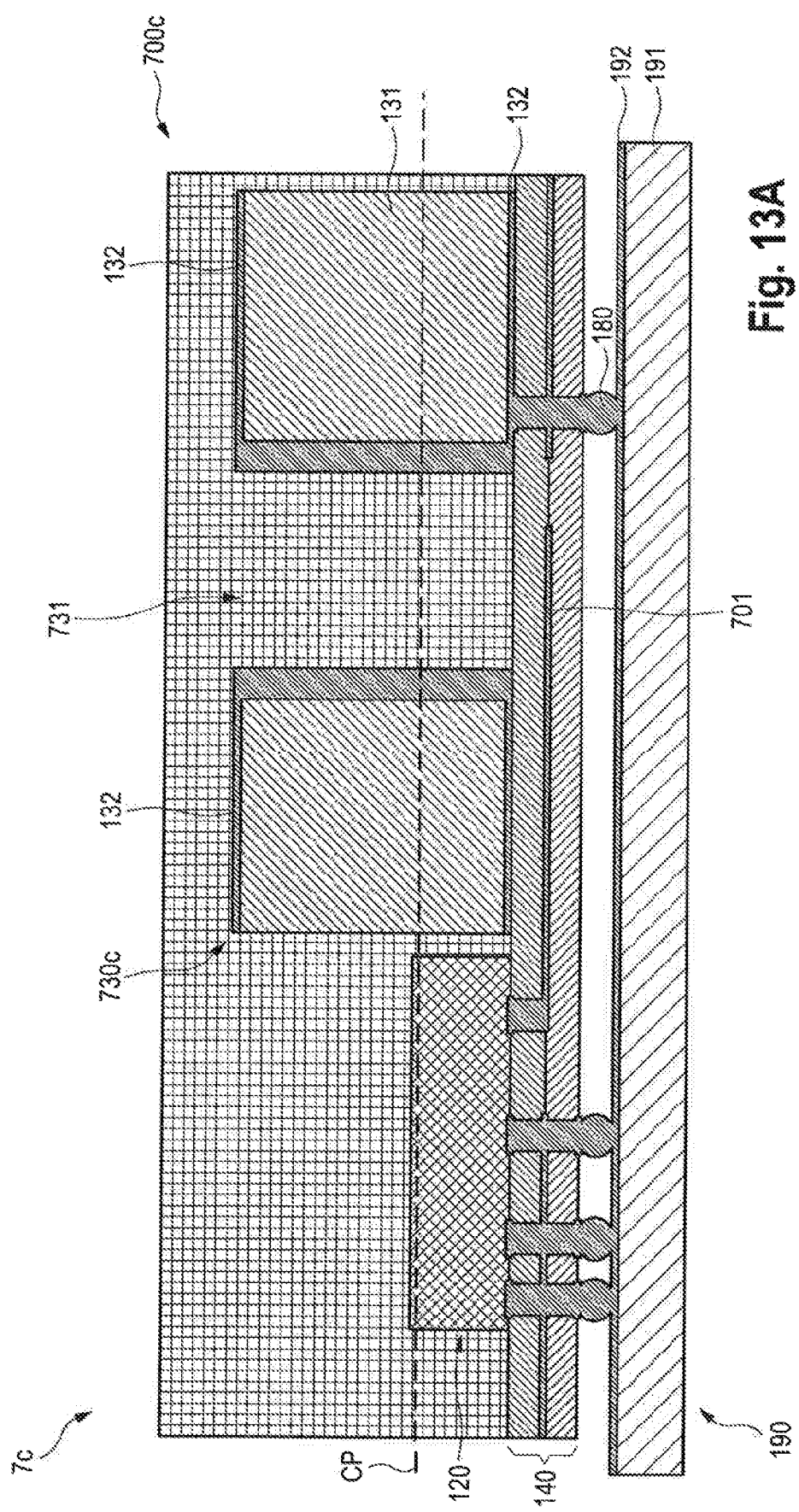
FIG. 13 shows a cross-sectional view and a top view of a twelfth embodiment of a microwave antenna package including a twelfth embodiment of a microwave antenna apparatus according to the present disclosure.
Figure 13B:
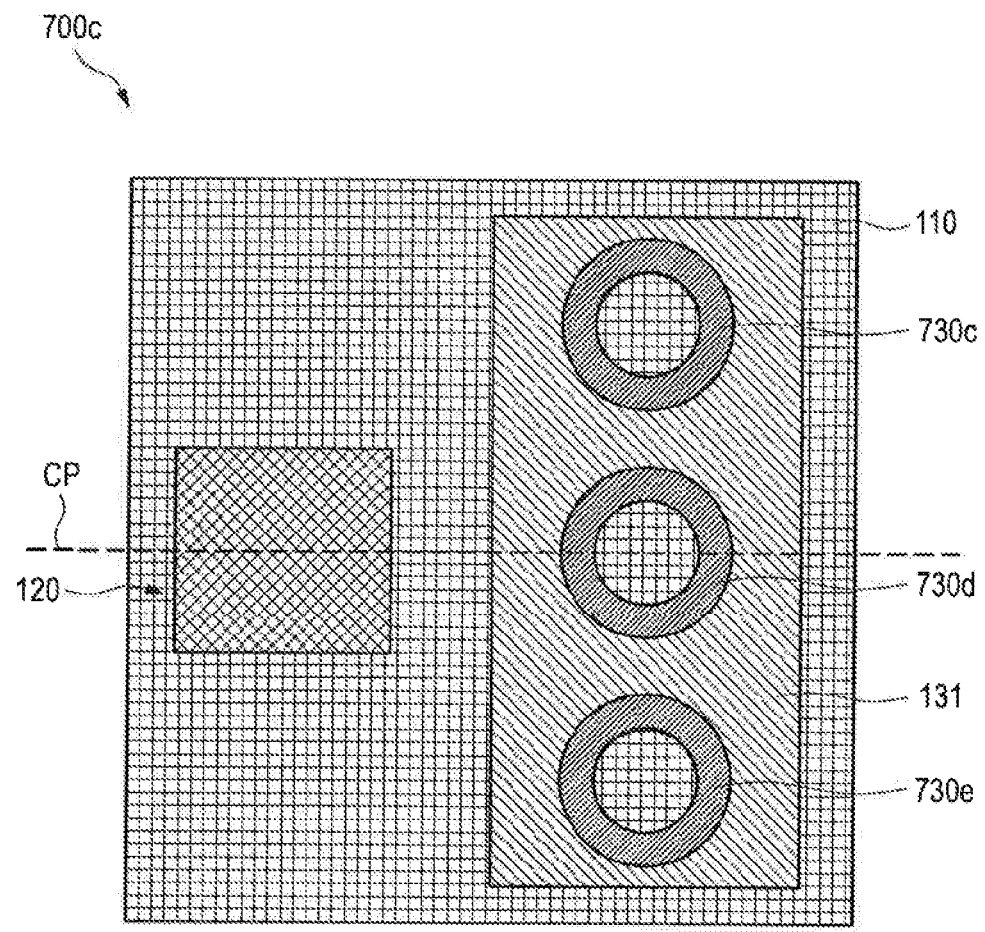

FIG. 13 shows a cross-sectional view (FIG. 13A) and a top view (FIG. 13B) of a twelfth embodiment of a microwave antenna package 7c including a twelfth embodiment of a microwave antenna apparatus 700c according to the present disclosure. In this embodiment the waveguide concept including a waveguide 731 as antenna element 730c is enhanced to antenna array topologies. An antenna array can be designed very cost efficient by utilizing multiple vias inside one laminate. Crosstalk between the antenna elements is reduced by appropriate shielding of the strip lines and antenna feeds on the redistribution layer. FIG. 13B shows a top view along the cutting plane CP of FIG. 13A. As shown there an antenna array of three antenna elements 730c, 730d, 730e may be used.

Figure 14A:
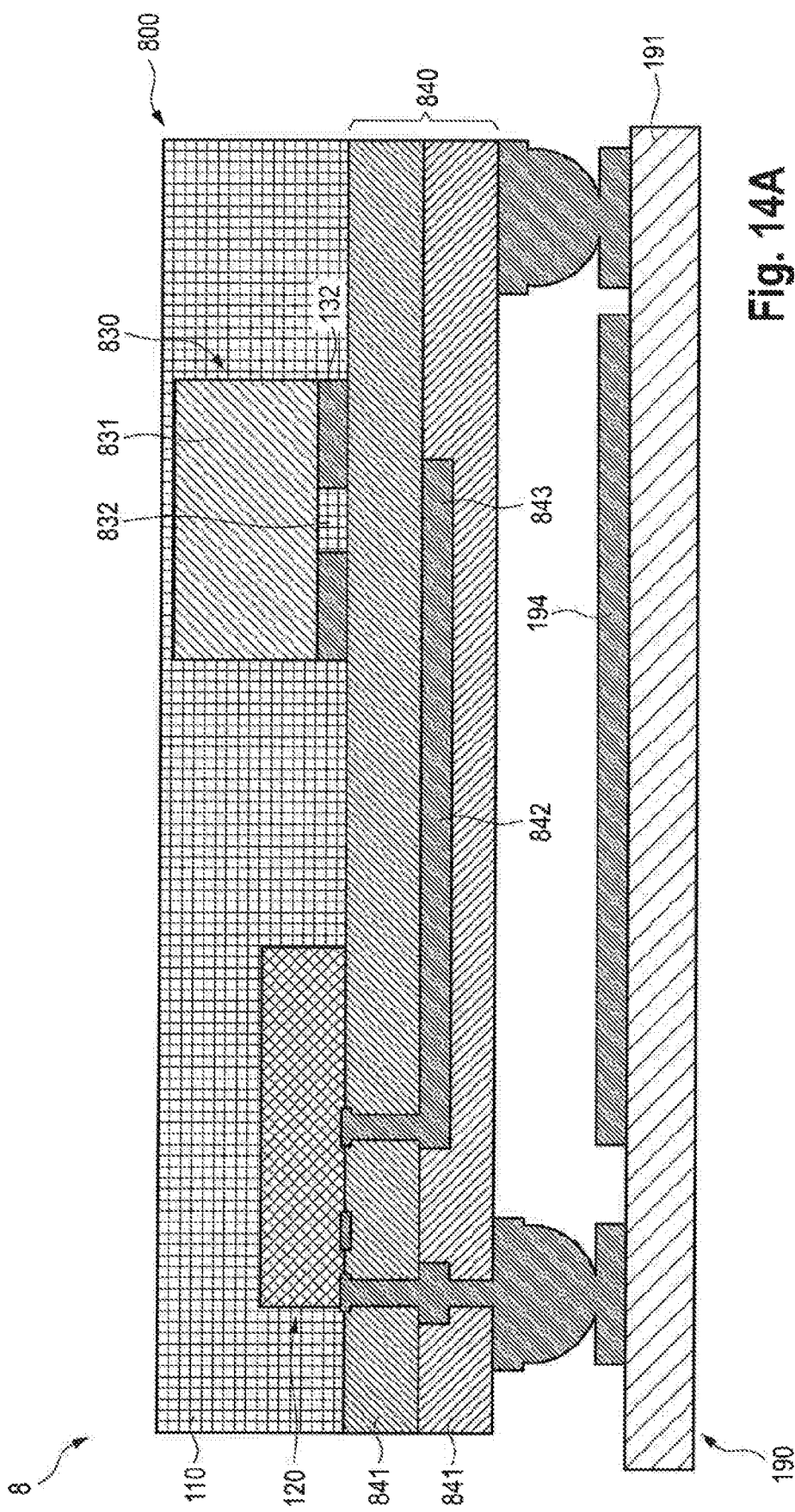
FIG. 14 shows a cross-sectional view and a top view of a thirteenth embodiment of a microwave antenna package including a thirteenth embodiment of a microwave antenna apparatus according to the present disclosure.
Figure 14B:
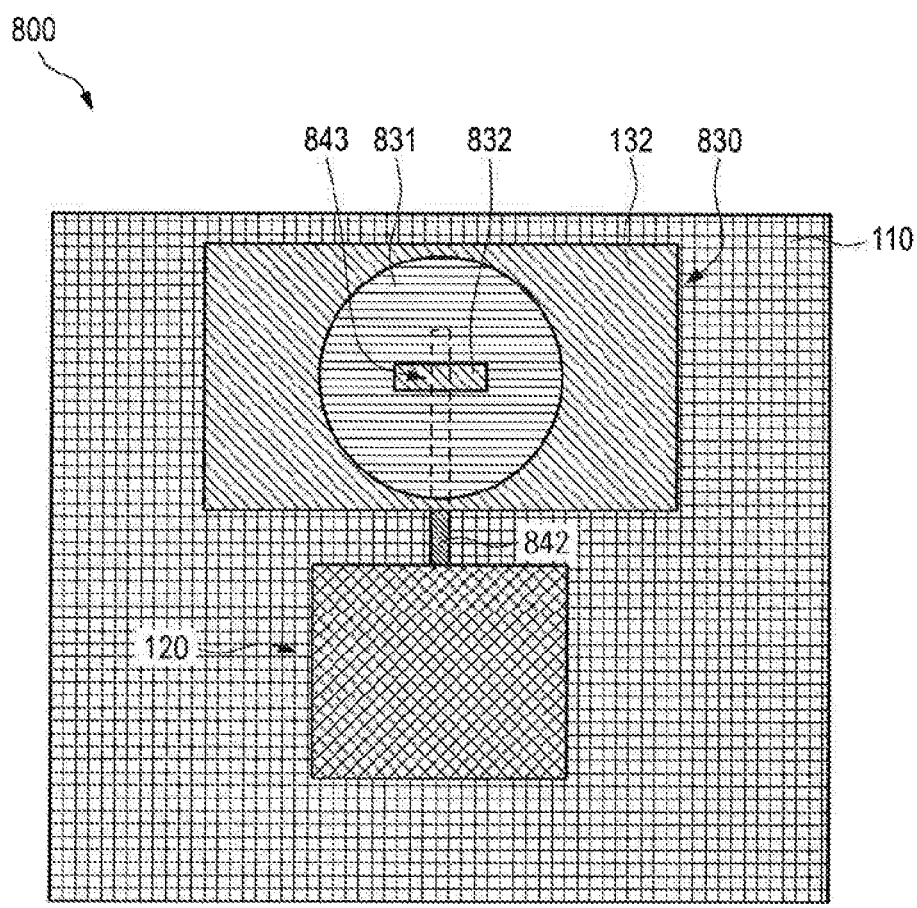

FIG. 14 shows a cross-sectional view (FIG. 14A) and a top view (FIG. 14B) of a thirteenth embodiment of a microwave antenna package 8 including a thirteenth embodiment of a microwave antenna apparatus 800 according to the present disclosure. In this embodiment a single or multiple dielectric resonator antennas (DRA) are placed into embedded wafer-level package using a pick and place machine like small SMT components.

In particular, in this embodiment the antenna element 830 is configured as dielectric resonator antenna comprising an antenna substrate layer 831 made of a dielectric resonator material and a ground layer 132 arranged on the first surface 134 of the antenna substrate layer 831 and having a slot 832 for coupling the feed to the dielectric resonator antenna. Further, the redistribution layer 840 comprises a redistribution substrate layer 841 made of a dielectric redistribution material, and the metal layer 842 is arranged within the redistribution layer 840 with its one end 843 arranged opposite the slot 832. An additional ground reflector 194 may be provided on top of the PCB layer 191.

DRAs can be integrated into the package level easily due to their small size at microwave and mm-wave frequencies. DRAs can be fabricated in various shapes such as cylindrical, rectangular, hemispherical structure allowing for flexibility in design. Different excitation techniques can be used such as probes, slot, microstrip lines, coplanar lines, antenna elements and waveguide slot.

This antenna type can be used at microwave/millimeter-wave frequencies since there is no inherent conductor loss. It offers high gain due to absence of conductors and surface wave losses. This leads to high radiation efficiency of this antenna type. A wide range of dielectric constants (from 2 to 100) allows the designer to have control over the physical size of the DRA and its bandwidth. This resonator antenna can be fabricated from a single high-resistivity silicon or GaAs substrate. Polymer-based (SU8, BCB, etc.) or ceramic resonators can also be used. An interconnect between the IC and the dielectric resonator takes place in a redistribution layer.

Figure 15:
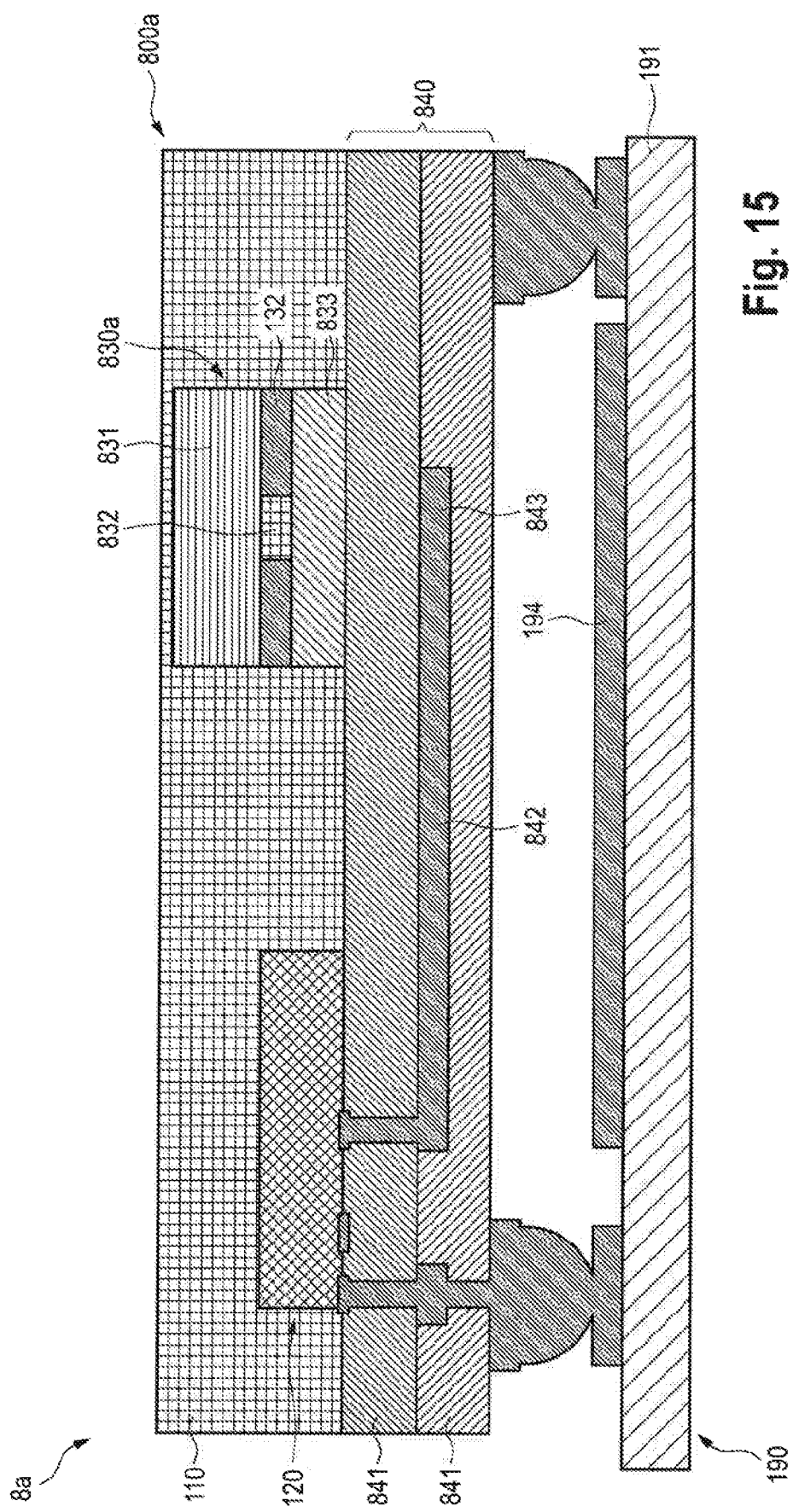
FIG. 15 shows a cross-sectional view of a fourteenth embodiment of a microwave antenna package including a fourteenth embodiment of a microwave antenna apparatus according to the present disclosure.

FIG. 15 shows a cross-sectional view of a fourteenth embodiment of a microwave antenna package 8a including a fourteenth embodiment of a microwave antenna apparatus 800a according to the present disclosure. In this embodiment the antenna element 830a further comprises an additional dielectric layer 833 between the ground layer 132 and the redistribution layer 840 and the metal layer 842 is used as primary antenna.

In this topology, the dielectric resonator of the antenna element 830a is fed by a primary antenna formed by the end 843 of the metal layer 842 through aperture coupling. The primary antenna is located in the redistribution layer level. The ground reflector 194, which is located directly on the PCB layer 191, can be used as a ground plane of the primary antenna (also called superstrate antenna). Slot coupled excitation is used to feed the low-permittivity resonators and to realize polymer-based resonator antennas.

Figure 16:
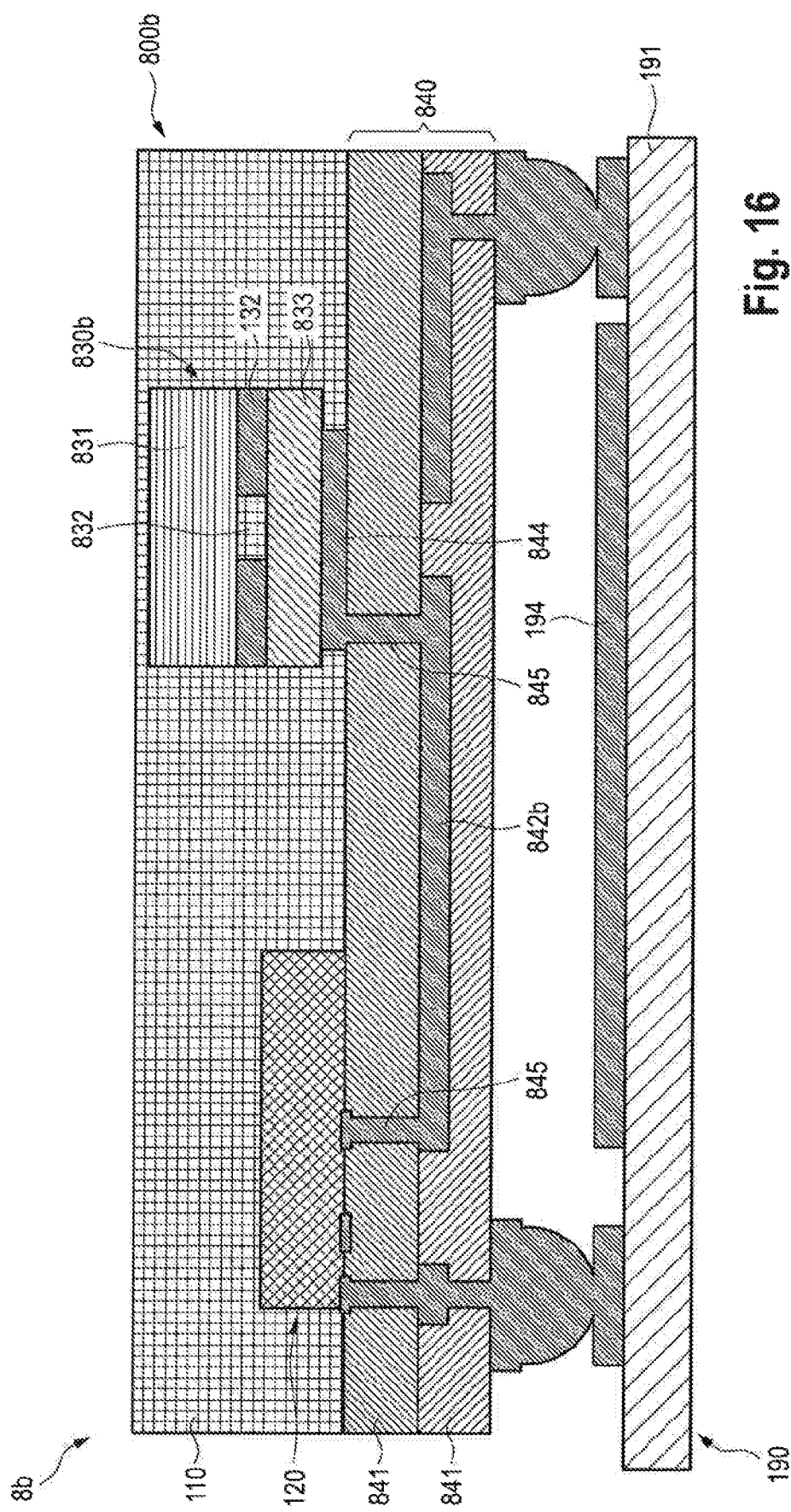
FIG. 16 shows a cross-sectional view of a fifteenth embodiment of a microwave antenna package including a fifteenth embodiment of a microwave antenna apparatus according to the present disclosure.

FIG. 16 shows a cross-sectional view of a fifteenth embodiment of a microwave antenna package 8b including a fifteenth embodiment of a microwave antenna apparatus 800b according to the present disclosure. In this embodiment, the redistribution layer 840 comprises a secondary antenna 844 on the surface of the redistribution layer 840 opposite the antenna element 830b and a connection 845 connecting the metal layer 842 and the secondary antenna 844.

This embodiment uses a similar topology as the embodiment shown in FIG. 15 employing a dielectric resonator antenna. Since the dielectric resonator antenna is used as a secondary antenna element, the primary antenna is placed into the integrated antenna element 830b this time. Interconnect among semiconductor element 120 and these integrated antennas takes place using signal vias 845 and transmission lines 842b in the redistribution layer 840.

Figure 17:
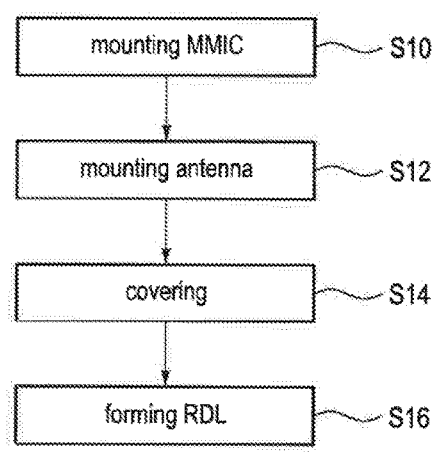
FIG. 17 shows a flow chart of a manufacturing method according to the present disclosure.

FIG. 17 shows a flow chart of a general embodiment of a manufacturing method according to the present disclosure. In a first step S10 a semiconductor element 120 is mounted on a dummy carrier, the semiconductor element comprising a semiconductor unit 121 and semiconductor feed lines 122 arranged on a first surface 123 of the semiconductor unit 121. In a second step S12 an antenna element 130, 230, 330, 430, 530, 630, 730, 830 is mounted on the dummy carrier, the antenna element comprising an antenna substrate layer 131 and a ground layer 132 arranged on or within the antenna substrate layer. In a third step S14 the semiconductor element and the antenna element are covered by a mold layer 110 of mold material such that an outer surface 124 of the semiconductor feed lines 122 is not covered by mold material and that the antenna element 30 is arranged within the mold layer 110. In a fourth step the dummy carrier is replaced by a redistribution layer 140, the redistribution layer comprising a redistribution substrate layer 141 and a metal layer 142, wherein the redistribution layer 140 is arranged on a surface 111 of the mold layer 110 such that the metal layer 142 is in contact with the outer surface 124 of one or more semiconductor feed lines 122.

Figure 18B:
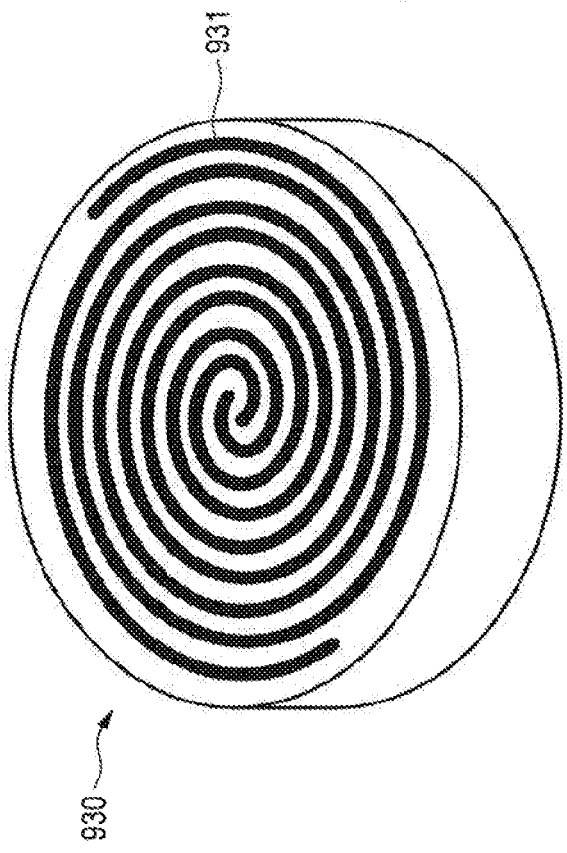
FIG. 18 shows different views of an Archimedean spiral antenna for use in a microwave antenna apparatus according to the present disclosure.
Figure 18A:
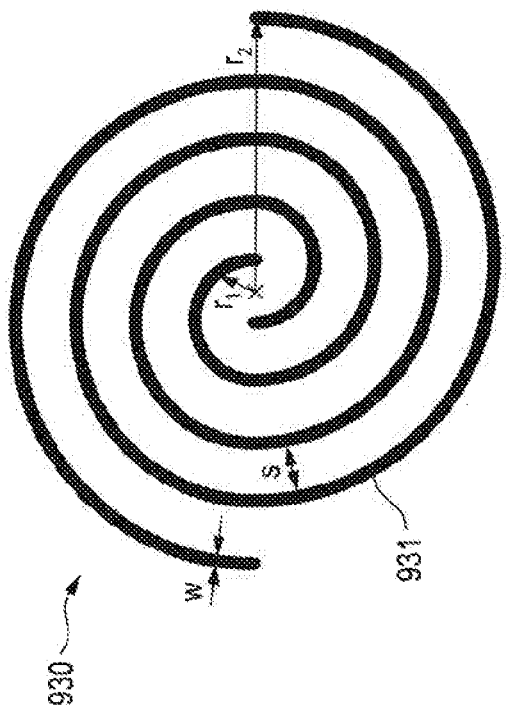
Figure 18C:
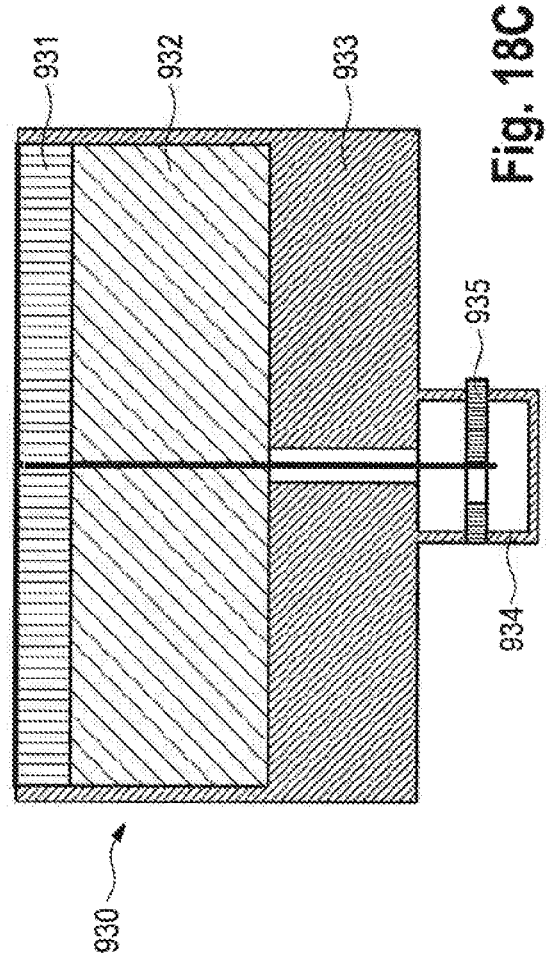

FIG. 18 shows another embodiment of an antenna element 930, in particular an Archimedean spiral antenna, in a top view (FIG. 18A), a perspective view (FIG. 18B) and a cross-sectional view (FIG. 18C). Such an antenna element 930 may also be used in the above described microwave antenna apparatus, i.e. such a cavity backed spiral antenna can also be placed into the package as an SMT antenna element. The antenna element 930 comprises a spiral radiator 931, an absorbing material 932 arranged below the spiral radiator 931, a cavity 933 arranged below the absorbing material 932 and a balun 934 with an input port 935 arranged below the cavity 933.

This antenna type provides a wide bandwidth and circular polarization. Cavity backing is done to convert a bidirectional pattern to a unidirectional pattern. Cavity backing also reduces the back radiation which degrades the antenna performance. It also reduces the mutual coupling among antenna arrays. Miniaturization can be achieved by using high permittivity material, which may also be done by introducing stubs into the design.

Figure 19B:
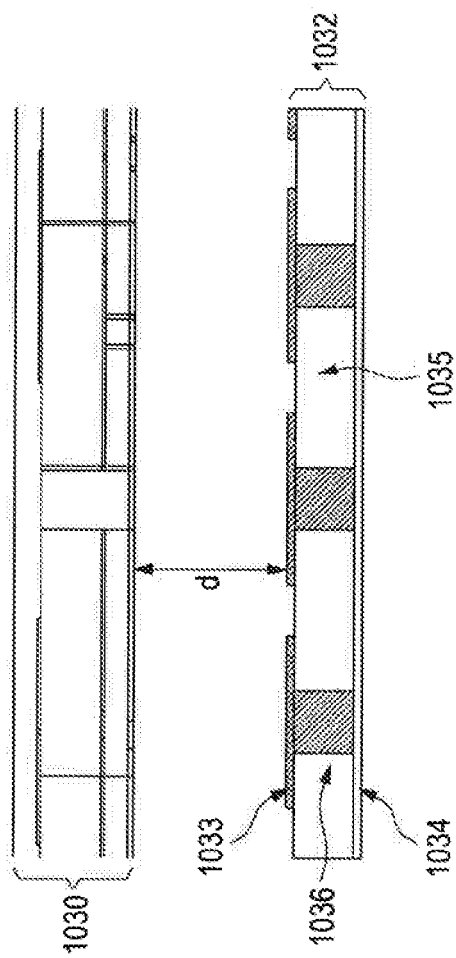
FIG. 19 shows a top view and a cross-sectional view of an antenna apparatus with an antenna element and EBG structures for use in a microwave antenna apparatus according to the present disclosure.
Figure 19A:
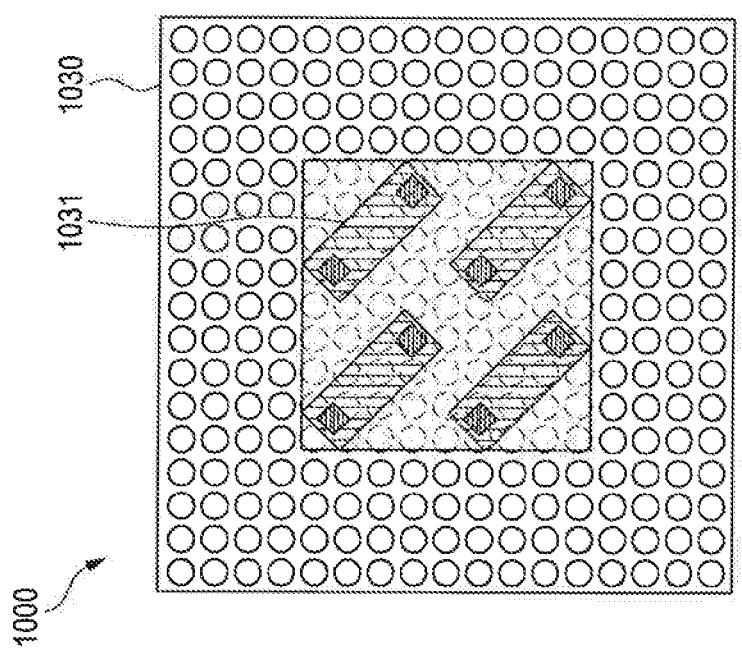

FIG. 19 shows a top view (FIG. 19A) and a cross-sectional view (FIG. 19B) of an antenna apparatus 1000 with an antenna element 1030 and EBG structures 1031 for use in a microwave antenna apparatus according to the present disclosure. Electromagnetic band gap structures (EBGs) can also be used together with eWLB type packages. EBGs are periodic structures, which may suppress surface waves and reduce edge scattering. When used as reflector, an EBG structure suppresses the higher order parallel plate modes by placing the EBG array 1032 (including a metallic patch 1033, a ground plane 1034, a substrate 1035 and vias 1036) and the antenna element 1030 at an appropriate distance d. The image currents are in phase with the original one hence can replace a PEC reflector.

FIG. 20 shows different views of a helical antenna 1130 for use in a microwave antenna apparatus according to the present disclosure, in particular a cross-sectional view (FIG. 20A), a perspective view (FIG. 20B) and a top view (FIG. 20C). Helical antennas, which are categorized in 3D directional antennas, have gained enormous attention for millimeter-wave applications because of their high gain, wide bandwidth, good axial ratio, circular polarization. This antenna type can also be embedded into an eWLB package if this antenna is designed on a multi-layer PCB. Among metallization layers substrates (not shown) are employed, i.e. metallization layers and substrates are stacked upon each other. The helical antenna 1130 is arranged above a ground plane 1131. Vias 1132 are used to connect the turns 1133 of the helical antenna 1130 to each other. Further, a feed line 1134 is arranged below the helical antenna 1130. FIG. 20C shows the substrate width w and a quarter wave stub 1135.

A dielectric loaded helix provides better performance than a conventional helix. Moreover, a helix antenna occupies less chip area than other planar or lens based antennas. In an array of helical antennas, insignificant crosstalk appears between adjacent antennas because the field tightly "hugs" the helix structure.

In the above described embodiment the feed line is coupled to the antenna element using connection lines or vias. Alternatively, the feed line can be coupled to the antenna electromagnetically.

Different kinds of antenna configurations can be used with the present disclosure, including slot coupled antennas, PIFA, SIW, coaxial based, waveguide based, etc. In general, any antenna designed on a separate antenna substrate integrated into a fan-out wafer level package that may be manufactured using a pick and place process and machine may be used.

The disclosed antennas and packages can be used in different applications, including communications systems or radar applications. Further, antenna arrays may be formed as e.g. used in MIMO operation.

According to preferred embodiment an increased radiation efficiency can be achieved by designing the antennas on microwave or FR4-based substrates and then embedding them into an emWLB package using a standard process. A degrading effect of the mold compound on a radiation pattern can be bypassed using additional SMT type antenna modules. An increased antenna gain can be achieved, which can be used for medium- and long-range radar applications. Further, an arrangement inside the eWLB package can be provided. Since RDL antennas are extremely sensitive to the exact location within the package, these additional antenna modules allow a more flexible placement of antennas. Still further, a design of PIFA antenna for the compactness at mm-wave frequencies can be provided. A new radiation efficient design of waveguide based antennas by designing the feed antennas on microwave substrates can also be realized, and usage can be made of laminate-based vias for wave transmission and antenna array configurations inside eWLB packages.

Thus, by the present disclosure the radiation efficiency of the antenna can be improved by using microwave/millimeter-wave multilayer substrates for the design and fabrication of antennas and place these SMT-type antennas into the package. A higher bandwidth is obtained which can be used for high resolution radars. By using FR4 substrate for the antenna design, the cost of the antenna module can be reduced since the cost of the design on Rogers substrate is almost 7 times higher than on FR4 type substrate. By employing PIFA antennas or aperture coupled antennas, a very compact antenna can be employed to develop a mm-wave radar.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

It follows a list of further embodiments of the disclosed subject matter:

1. Microwave antenna apparatus (100, 100a, 200, 300, 400, 500, 600, 700, 700a, 700b, 700c, 800, 800a, 800b) comprising:
    a mold layer (110) of mold material,
    a semiconductor element (120) comprising a semiconductor unit (121) and semiconductor feed lines (122) arranged on a first surface (123) of the semiconductor unit (121), wherein the semiconductor element is arranged within the mold layer (110) such that an outer surface (124) of the semiconductor feed lines (122) is not covered by mold material,
    an antenna element (130, 130a, 230, 330, 430, 530, 630, 730, 730a, 730b, 730c, 830, 830a, 830b) comprising an antenna substrate layer (131) and a ground layer (132) arranged on or within the antenna substrate layer, wherein the antenna element is arranged within the mold layer (110), and
    a redistribution layer (140, 840) comprising at least one redistribution substrate layer (141) and a metal layer (142), wherein the redistribution layer (140) is arranged on a surface (111) of the mold layer (110) and configured such that the metal layer (142) is in contact with the outer surface (124) of one or more semiconductor feed lines (122),
    wherein a radiating element (135) is arranged either on a second surface (136) of the antenna substrate layer (131) facing away from the redistribution layer (140) or within or on the redistribution layer (140).

2. Microwave antenna apparatus as defined in any preceding embodiment, wherein the antenna element (130, 230, 330) is configured as an SMD component.

3. Microwave antenna apparatus as defined in any preceding embodiment,
wherein the antenna substrate layer (131, 232) is made of a microwave material, or of a BT, FR4 or FR408 type substrate material, or of ceramics, or of Rogers substrate material, of PTFE, or of a mold type material.

4. Microwave antenna apparatus as defined in any preceding embodiment,
wherein multiple antenna elements (130a, 130b, 130c, 130d) are arranged within the mold layer (110), in particular around the semiconductor element (120).

5. Microwave antenna apparatus as defined in any preceding embodiment,
wherein the antenna element (130, 430, 530) comprises one or more antenna feed lines (133) arranged on a first surface (134) of the antenna substrate layer (131) opposite the second surface (136) and the radiating element (135) arranged on the second surface (136) of the antenna substrate layer (131), wherein the antenna element (130) is arranged within the mold layer (110) such that an outer surface (137) of the antenna feed lines (133) is not covered by mold material, and
wherein the redistribution layer (140) is arranged on the surface (111) of the mold layer (110) such that the metal layer (142) is in contact with the outer surfaces (137) of one or more antenna feed lines (133).

6. Microwave antenna apparatus as defined in embodiment 5,
wherein the antenna element (430) comprises one or more connection lines (431) connecting one or more antenna feed lines (133) with the radiating element (135) through the substrate layer (131).

7. Microwave antenna apparatus as defined in embodiment 6,
wherein the antenna element (430) comprises one or more parasitic elements (432) arranged within the antenna substrate layer (131) between the ground layer (132) arranged within the antenna substrate layer (131) and one or more antenna feed lines (133).

8. Microwave antenna apparatus as defined in embodiment 6 or 7,
wherein the antenna element (530) comprises one or more connection lines (531) connecting one or more antenna feed lines (133) with the radiating element (135) through the substrate layer (131) and one or more vias (532) connecting the metal layer (142) with the antenna element (135).

9. Microwave antenna apparatus as defined in any preceding embodiment,
wherein the ground layer (132) is arranged on the second surface (136) of the antenna substrate layer (131) and the radiating element (135) is arranged in the redistribution layer (140) and is in contact with the metal layer (142).

10. Microwave antenna apparatus as defined in any preceding embodiment,
wherein the antenna element (230, 630) comprises one or more connection lines (231, 633) connecting the metal layer (142) or the ground layer (132), which is arranged on the first surface (134) of the antenna substrate layer (131) opposite the second surface (136), with the radiating element (135), which is arranged on the second surface (136) of the antenna substrate layer (131), through the substrate layer (131).

11. Microwave antenna apparatus as defined in any preceding embodiment,
wherein the antenna element (630) comprises a microcoaxial transmission line (631) arranged within the antenna substrate layer (131) and connected to the metal layer (142).

12. Microwave antenna apparatus as defined in any preceding embodiment,
wherein the antenna element (730) comprises a open ended waveguide structure (731) and wherein the radiating element comprises a waveguide feed (701) arranged in or on the redistribution layer (140) opposite the open ended waveguide structure (731).

13. Microwave antenna apparatus as defined in any preceding embodiment0,
wherein the antenna element (830) is configured as dielectric resonator antenna comprising an antenna substrate layer (831) made of a dielectric resonator material and a ground layer (132) arranged on the first surface (134) of the antenna substrate layer (831) and having a slot (832), and
wherein the redistribution layer (840) comprises a redistribution substrate layer (841) made of a dielectric redistribution material, wherein the metal layer (842) is arranged within the redistribution layer (840) with its one end (843) arranged opposite the slot (832).

14. Microwave antenna apparatus as defined in any preceding embodiment3,
wherein the antenna element (830a) further comprises an additional dielectric layer (833) between the ground layer (132) and the redistribution layer (840) and wherein the metal layer (842) is used as primary antenna.

15. Microwave antenna apparatus as defined in any preceding embodiment4, wherein the redistribution layer (840) further comprises a secondary antenna (844) on the surface of the redistribution layer (840) opposite the antenna element (830b) and a connection (845) connecting the metal layer (842) and the secondary antenna (844).

16. Microwave antenna apparatus as defined in any preceding embodiment,
wherein the antenna element comprises a spiral antenna (930), a helical antenna (1130) or an antenna/1030) comprising electromagnetic band gap structures.

17. Microwave antenna package (1) comprising
a PCB arrangement (190) comprising a PCB layer (191) and
a microwave antenna apparatus (100, 200, 300, 400, 500, 600, 700, 800) as defined in any preceding embodiment coupled to the PCB arrangement forming a fan-out wafer level package.

18. Microwave antenna package as defined in any preceding embodiment7,
wherein the redistribution layer (140) of the microwave antenna apparatus (100) comprises an under bump metallization layer (143) on a surface (144) of the redistribution layer (140) facing away from the mold layer (110), said under bump metallization layer (143) being in contact with strip lines (192) of the PCB arrangement (190).

19. Microwave antenna package as defined in any preceding embodiment7,
wherein the radiating element (135) of the microwave antenna apparatus (100) is arranged in the redistribution layer (140) and is in contact with the metal layer (142) and wherein the PCB layer (191) comprises a waveguide (193) opposite the radiating element (135).

20. Method of manufacturing a microwave antenna apparatus as defined in any one of embodiments 1 to 16, said method comprising:
mounting (S10) a semiconductor element (120) on a dummy carrier, the semiconductor element comprising a semiconductor unit (121) and semiconductor feed lines (122) arranged on a first surface (123) of the semiconductor unit (121),
mounting (S12) an antenna element (130, 230, 330, 430, 530, 630, 730, 830) on the dummy carrier, the antenna element comprising an antenna substrate layer (131) and a ground layer (132) arranged on or within the antenna substrate layer,
covering (S14) the semiconductor element and the antenna element by a mold layer (110) of mold material such that an outer surface (124) of the semiconductor feed lines (122) is not covered by mold material and that the antenna element (30) is arranged within the mold layer (110), and
replacing (S16) the dummy carrier by a redistribution layer (140), the redistribution layer comprising a redistribution substrate layer (141) and a metal layer (142), wherein the redistribution layer (140) is arranged on a surface (111) of the mold layer (110) such that the metal layer (142) is in contact with the outer surface (124) of one or more semiconductor feed lines (122),
wherein a radiating element (135) is arranged either on a second surface (136) of the antenna substrate layer (131) facing away from the redistribution layer (140) or within or on the redistribution layer (140).

The invention claimed is:
1. Microwave antenna apparatus comprising:
a mold layer of mold material,
a semiconductor element comprising a semiconductor unit and semiconductor feed lines on a first surface of the semiconductor unit, wherein the semiconductor element is within the mold layer such that an outer surface of the semiconductor feed lines is not covered by mold material,
an antenna element comprising an antenna substrate layer and a ground layer, wherein the antenna element is within the mold layer, and
a redistribution layer comprising at least one redistribution substrate layer and a metal layer, wherein the redistribution layer is on a surface of the mold layer such that the metal layer is in contact with the outer surface of one or more semiconductor feed lines, wherein
a radiating element is either on a surface of the antenna substrate layer facing away from the redistribution layer or within or on the redistribution layer, and
the ground layer is on a surface of the antenna substrate layer facing the redistribution layer, on a surface of the antenna substrate layer facing away from the redistribution layer, or within the antenna substrate layer, wherein the antenna element comprises one or more connection lines connecting the metal layer or the ground layer on the surface of the antenna substrate layer facing the redistribution layer with the radiating element on the surface of the antenna substrate layer facing away from the redistribution layer through the antenna substrate layer.

2. Microwave antenna apparatus as claimed in claim 1, wherein the antenna element is configured as an SMD component.

3. Microwave antenna apparatus as claimed in claim 1, wherein the antenna substrate layer is made of a microwave material, or of a BT, FR4 or FR408 type substrate material, or of ceramics, or of Rogers substrate material, of FIFE, or of a mold type material.

4. Microwave antenna apparatus as claimed in claim 1, wherein multiple antenna elements are within the mold layer, in particular, around the semiconductor element.

5. Microwave antenna apparatus, comprising:
a mold layer of mold material,
a semiconductor element comprising a semiconductor unit and semiconductor feed lines on a first surface of the semiconductor unit, wherein the semiconductor element is within the mold layer such that an outer surface of the semiconductor feed lines is not covered by mold material,
an antenna element comprising an antenna substrate layer and a ground layer, wherein the antenna element is within the mold layer, and
a redistribution layer comprising at least one redistribution substrate layer and a metal layer, wherein the redistribution layer is on a surface of the mold layer such that the metal layer is in contact with the outer surface of one or more semiconductor feed lines, wherein
a radiating element is either on a surface of the antenna substrate layer facing away from the redistribution layer or within or on the redistribution layer,
the ground layer is on a surface of the antenna substrate layer facing the redistribution layer, on a surface of the antenna substrate layer facing away from the redistribution layer, or within the antenna substrate layer,
the antenna element comprises one or more antenna feed lines on surface of the antenna substrate layer facing the redistribution layer and the radiating element on the surface of the antenna substrate layer facing away from the redistribution layer, wherein the antenna element is within the mold layer such that an outer surface of the antenna feed lines is not covered by mold material, and the redistribution layer is on the surface of the mold layer such that the metal layer is in contact with the outer surfaces of one or more antenna feed lines.

6. Microwave antenna apparatus as claimed in claim 5, wherein the antenna element comprises one or more connection lines connecting one or more antenna feed lines with the radiating element through the substrate layer.

7. Microwave antenna apparatus as claimed in claim 6, wherein the antenna element comprises one or more parasitic elements within the antenna substrate layer between the ground layer within the antenna substrate layer and one or more antenna feed lines.

8. Microwave antenna apparatus as claimed in claim 6, wherein the antenna element comprises one or more connection lines connecting one or more antenna feed lines with the radiating element through the substrate layer and one or more via connecting the metal layer with the antenna element.

9. Microwave antenna apparatus as claimed in claim 1, wherein the ground layer is on the surface of the antenna substrate layer facing the redistribution layer and the radiating element is in the redistribution layer and is in contact with the metal layer.

10. Microwave antenna apparatus as claimed in claim 1, wherein the antenna element comprises a micro-coaxial transmission line within the antenna substrate layer and connected to the metal layer.

11. Microwave antenna apparatus as claimed in claim 1, wherein the antenna element comprises an open ended waveguide structure and wherein the radiating element comprises a waveguide feed in or on the redistribution layer opposite the open ended waveguide structure.

12. Microwave antenna apparatus, comprising:
a mold layer of mold material,
a semiconductor element comprising a semiconductor unit and semiconductor feed lines on a first surface of the semiconductor unit, wherein the semiconductor element is within the mold layer such that an outer surface of the semiconductor feed lines is not covered by mold material,
an antenna element comprising an antenna substrate layer and a ground layer on or within the antenna substrate layer, wherein the antenna element is within the mold layer, and
a redistribution layer comprising at least one redistribution substrate layer and a metal layer, wherein the redistribution layer is on a surface of the mold layer such that the metal layer is in contact with the outer surface of one or more semiconductor feed lines,
wherein a radiating element is either on a surface of the antenna substrate layer facing away from the redistribution layer or within or on the redistribution layer, and
wherein the antenna element is configured as dielectric resonator antenna comprising an antenna substrate layer made of a dielectric resonator material and a ground layer on the surface of the antenna substrate layer facing the redistribution layer and having a slot, and wherein the redistribution layer comprises a redistribution substrate layer made of a dielectric redistribution material, wherein the metal layer is within the redistribution layer with one end opposite the slot, wherein
the antenna element further comprises an additional dielectric layer between the ground layer and the redistribution layer,
the metal layer is used as primary antenna, and
the redistribution layer further comprises a secondary antenna on the surface of the redistribution layer opposite the antenna element and a connection connecting the metal layer and the secondary antenna.

13. Microwave antenna apparatus as claimed in claim 1, wherein the antenna element comprises a spiral antenna, a helical antenna or an antenna comprising electromagnetic band gap structures.

14. Microwave antenna package comprising
a PCB arrangement comprising a PCB layer and
a microwave antenna apparatus as claimed in claim 1 coupled to the PCB arrangement forming a fan-out wafer level package.

15. Microwave antenna package as claimed in claim 14, wherein the redistribution layer of the microwave antenna apparatus comprises an under bump metallization layer on a surface of the redistribution layer facing away from the mold layer said under bump metallization layer being in contact with strip lines of the PCB arrangement.

16. Microwave antenna package as claimed in claim 14, wherein the radiating element of the microwave antenna apparatus is in the redistribution layer and is in contact with the metal layer and wherein the PCB layer comprises a waveguide opposite the radiating element.

* * * * *